United States Patent
Jang et al.

(10) Patent No.: US 11,218,172 B2
(45) Date of Patent: Jan. 4, 2022

(54) DATA INTERLEAVING DEVICE AND METHOD IN WIRELESS COMMUNICATION SYSTEM USING POLAR CODE

(71) Applicants: Samsung Electronics Co., Ltd., Suwon-si (KR); Industry Foundation of Chonnam National University, Gwangju (KR)

(72) Inventors: Min Jang, Seongnam-si (KR); Hosung Park, Gwangju (KR); Jaeyoel Kim, Seongnam-si (KR); Seokki Ahn, Suwon-si (KR); Hongsil Jeong, Suwon-si (KR)

(73) Assignees: Samsung Electronics Co., Ltd., Suwon-si (KR); Industry Foundation of Chonnam National University, Gwangju (KR)

( * ) Notice: Subject to any disclaimer, the term of this patent is extended or adjusted under 35 U.S.C. 154(b) by 0 days.

(21) Appl. No.: 16/637,697

(22) PCT Filed: Jul. 27, 2018

(86) PCT No.: PCT/KR2018/008556
§ 371 (c)(1),
(2) Date: Feb. 7, 2020

(87) PCT Pub. No.: WO2019/031742
PCT Pub. Date: Feb. 14, 2019

(65) Prior Publication Data
US 2021/0152186 A1    May 20, 2021

(30) Foreign Application Priority Data

Aug. 8, 2017  (KR) .......... 10-2017-0100583

(51) Int. Cl.
*H03M 13/27* (2006.01)
*H03M 13/13* (2006.01)
(Continued)

(52) U.S. Cl.
CPC .......... *H03M 13/27* (2013.01); *H03M 13/13* (2013.01); *H03M 13/29* (2013.01)

(58) Field of Classification Search
CPC ...... H03M 13/27; H03M 13/13; H03M 13/29; H03M 13/2789
See application file for complete search history.

(56) References Cited

U.S. PATENT DOCUMENTS 10,644,835 B1 * 5/2020 Abotabl ................ H03M 13/27
2005/0251725 A1 * 11/2005 Huang .............. H03M 13/2789
714/752

(Continued)

OTHER PUBLICATIONS

Nokia, "Distributed CRC Polar code construction", 3GPP TSG RAN WG1 NR Ad-Hoc #2, Jun. 27-30, 2017, R1-1711539, 5 pages.
(Continued)

*Primary Examiner* — Justin R Knapp

(57) ABSTRACT

Disclosed are: a communication technique for merging, with IoT technology, a 5G communication system for supporting a data transmission rate higher than that of a 4G system; and a system therefor. The present disclosure can be applied to intelligent services (for example, smart home, smart building, smart city, smart car or connected car, healthcare, digital education, retail, security and safety related services, and the like) on the basis of 5G communication technology and IoT-related technology.

15 Claims, 9 Drawing Sheets

(51) Int. Cl.
    *H03M 13/00*     (2006.01)
    *H03M 13/29*     (2006.01)

(56) References Cited

U.S. PATENT DOCUMENTS

| | | |
|---|---|---|
| 2016/0079999 A1 | 3/2016 | Shen et al. |
| 2016/0182187 A1 | 6/2016 | Kim et al. |
| 2016/0308643 A1 | 10/2016 | Li et al. |
| 2020/0067525 A1* | 2/2020 | Jayasinghe ....... H03M 13/2906 |
| 2020/0099471 A1* | 3/2020 | Ye ..................... H04L 1/0067 |
| 2020/0244288 A1* | 7/2020 | Noh .................... H04L 1/0047 |

OTHER PUBLICATIONS

Tsofun Algorithm, "Study of Split-CRC Polar Code Construction for Early Termination", 3GPP TSG RAN WG1 NR Ad-Hoc #2, Jun. 27-30, 2017, R1-1709883, 27 pages.
Nokia et al., "Design details of distributed CRC", 3GPP TSG RAN WG1 Meeting #89, May 15-19, 2017, R1-1708833, 7 pages.
International Search Report dated Nov. 2, 2018 in connection with International Patent Application No. PCT/KR2018/008556, 2 pages.
Written Opinion of the International Searching Authority dated Nov. 2, 2018 in connection with International Patent Application No. PCT/KR2018/008556, 6 pages.

* cited by examiner

Prior Art

FIG. 5

|    | P1 | P2 | P3 | P4 |
|----|----|----|----|----|
| 12 | 0  | 0  | 0  | 1  |
| 11 | 1  | 1  | 0  | 0  |
| 10 | 0  | 1  | 1  | 0  |
| 9  | 0  | 0  | 1  | 1  |
| 8  | 1  | 1  | 0  | 1  |
| 7  | 1  | 0  | 1  | 0  |
| 6  | 0  | 1  | 0  | 1  |
| 5  | 1  | 1  | 1  | 0  |
| 4  | 0  | 1  | 1  | 1  |
| 3  | 1  | 1  | 1  | 1  |
| 2  | 1  | 0  | 1  | 1  |
| 1  | 1  | 0  | 0  | 1  |

FIG. 6A

|  | P3 | P1 | P2 |
|---|---|---|---|
| 12 | 0 | 0 | 0 |
| 11 | 0 | 1 | 1 |
| 10 | 1 | 0 | 1 |
| 9 | 1 | 0 | 0 |
| 8 | 0 | 1 | 1 |
| 7 | 1 | 1 | 0 |
| 6 | 0 | 0 | 1 |
| 5 | 1 | 1 | 1 |
| 4 | 1 | 0 | 1 |
| 3 | 1 | 1 | 1 |
| 2 | 1 | 1 | 0 |
| 1 | 0 | 1 | 0 |

FIG. 6B

|    | P3 | P1 | P2 |
|----|----|----|----|
| 12 | 0  | 0  | 0  |
| 6  | 0  | 0  | 1  |
| 11 | 0  | 1  | 1  |
| 8  | 0  | 1  | 1  |
| 1  | 0  | 1  | 0  |
| 10 | 1  | 0  | 1  |
| 9  | 1  | 0  | 0  |
| 7  | 1  | 1  | 0  |
| 5  | 1  | 1  | 1  |
| 4  | 1  | 0  | 1  |
| 3  | 1  | 1  | 1  |
| 2  | 1  | 1  | 0  |

FIG. 7A

| K | EXISTING | DISCLOSURE | K | EXISTING | DISCLOSURE | K | EXISTING | DISCLOSURE | K | EXISTING | DISCLOSURE |
|---|---|---|---|---|---|---|---|---|---|---|---|
| 200 | 0.21833 | 0.21333 | 150 | 0.22000 | 0.22222 | 100 | 0.21500 | 0.23500 | 50 | 0.19000 | 0.25667 |
| 199 | 0.21859 | 0.21441 | 149 | 0.21700 | 0.22260 | 99 | 0.21717 | 0.23737 | 49 | 0.17347 | 0.24830 |
| 198 | 0.21886 | 0.21044 | 148 | 0.21171 | 0.22297 | 98 | 0.21939 | 0.23810 | 48 | 0.17014 | 0.25347 |
| 197 | 0.21658 | 0.21151 | 147 | 0.21202 | 0.22109 | 97 | 0.21993 | 0.23196 | 47 | 0.17376 | 0.25887 |
| 196 | 0.21684 | 0.21088 | 146 | 0.20890 | 0.22260 | 96 | 0.21354 | 0.23264 | 46 | 0.16667 | 0.24275 |
| 195 | 0.21709 | 0.21197 | 145 | 0.20690 | 0.22414 | 95 | 0.21404 | 0.23333 | 45 | 0.14815 | 0.24074 |
| 194 | 0.21821 | 0.21306 | 144 | 0.20718 | 0.22454 | 94 | 0.21454 | 0.22518 | 44 | 0.14773 | 0.24621 |
| 193 | 0.21934 | 0.21416 | 143 | 0.20396 | 0.22494 | 93 | 0.21685 | 0.22760 | 43 | 0.13953 | 0.25194 |
| 192 | 0.22049 | 0.21354 | 142 | 0.19836 | 0.22653 | 92 | 0.21920 | 0.22826 | 42 | 0.13492 | 0.25000 |
| 191 | 0.22164 | 0.21466 | 141 | 0.19858 | 0.22459 | 91 | 0.22161 | 0.23077 | 41 | 0.13821 | 0.25203 |
| 190 | 0.22281 | 0.21491 | 140 | 0.20000 | 0.22500 | 90 | 0.22222 | 0.23333 | 40 | 0.14167 | 0.25833 |
| 189 | 0.22399 | 0.21605 | 139 | 0.20144 | 0.22662 | 89 | 0.22097 | 0.23408 | 39 | 0.14530 | 0.26496 |
| 188 | 0.22340 | 0.21631 | 138 | 0.20169 | 0.22585 | 88 | 0.22348 | 0.23674 | 38 | 0.14912 | 0.26754 |
| 187 | 0.22460 | 0.21747 | 137 | 0.20195 | 0.22628 | 87 | 0.22605 | 0.23372 | 37 | 0.14865 | 0.27477 |
| 186 | 0.22491 | 0.21864 | 136 | 0.20343 | 0.22672 | 86 | 0.22481 | 0.23256 | 36 | 0.15278 | 0.27315 |
| 185 | 0.22613 | 0.21712 | 135 | 0.20370 | 0.22840 | 85 | 0.22745 | 0.22549 | 35 | 0.15238 | 0.28095 |
| 184 | 0.22373 | 0.21830 | 134 | 0.20522 | 0.22512 | 84 | 0.23016 | 0.22619 | 34 | 0.15196 | 0.26471 |
| 183 | 0.22404 | 0.21767 | 133 | 0.20050 | 0.22431 | 83 | 0.22088 | 0.22892 | 33 | 0.14646 | 0.27273 |
| 182 | 0.22527 | 0.21612 | 132 | 0.20076 | 0.22601 | 82 | 0.21748 | 0.23171 | 32 | 0.15104 | 0.28125 |
| 181 | 0.22284 | 0.21639 | 131 | 0.19975 | 0.22774 | 81 | 0.21811 | 0.22222 | 31 | 0.15591 | 0.28495 |
| 180 | 0.22315 | 0.21759 | 130 | 0.20128 | 0.22692 | 80 | 0.21250 | 0.22500 | 30 | 0.16111 | 0.29444 |
| 179 | 0.22439 | 0.21322 | 129 | 0.20155 | 0.22739 | 79 | 0.21097 | 0.22574 | 29 | 0.16667 | 0.28736 |
| 178 | 0.22004 | 0.21442 | 128 | 0.20313 | 0.22656 | 78 | 0.21368 | 0.22863 | 28 | 0.14881 | 0.29762 |
| 177 | 0.22034 | 0.21563 | 127 | 0.20472 | 0.22703 | 77 | 0.20996 | 0.23160 | 27 | 0.14815 | 0.29630 |
| 176 | 0.22064 | 0.21402 | 126 | 0.20635 | 0.22884 | 76 | 0.20614 | 0.23465 | 26 | 0.15385 | 0.28846 |
| 175 | 0.22190 | 0.21524 | 125 | 0.20667 | 0.22933 | 75 | 0.20444 | 0.23556 | 25 | 0.16000 | 0.29333 |
| 174 | 0.22222 | 0.21456 | 124 | 0.20833 | 0.22581 | 74 | 0.20721 | 0.23874 | 24 | 0.15972 | 0.30556 |
| 173 | 0.22254 | 0.21484 | 123 | 0.20732 | 0.22629 | 73 | 0.21005 | 0.24201 | 23 | 0.14493 | 0.31884 |
| 172 | 0.22287 | 0.21512 | 122 | 0.20902 | 0.22541 | 72 | 0.21296 | 0.24306 | 22 | 0.14394 | 0.33333 |
| 171 | 0.22320 | 0.21540 | 121 | 0.20937 | 0.22590 | 71 | 0.21596 | 0.24648 | 21 | 0.15079 | 0.31746 |
| 170 | 0.22353 | 0.21471 | 120 | 0.20556 | 0.22778 | 70 | 0.21667 | 0.25000 | 20 | 0.15833 | 0.31667 |
| 169 | 0.22387 | 0.21598 | 119 | 0.20308 | 0.22969 | 69 | 0.21981 | 0.25362 | 19 | 0.16667 | 0.30702 |
| 168 | 0.22520 | 0.21528 | 118 | 0.20339 | 0.23164 | 68 | 0.21814 | 0.25735 | 18 | 0.12963 | 0.32407 |
| 167 | 0.22655 | 0.21657 | 117 | 0.20228 | 0.23219 | 67 | 0.22139 | 0.25373 | 17 | 0.12745 | 0.30392 |
| 166 | 0.22791 | 0.21787 | 116 | 0.20402 | 0.23420 | 66 | 0.22475 | 0.25505 | 16 | 0.13542 | 0.26042 |
| 165 | 0.22727 | 0.21919 | 115 | 0.20435 | 0.23623 | 65 | 0.21282 | 0.25897 | 15 | 0.14444 | 0.27778 |
| 164 | 0.22866 | 0.21951 | 114 | 0.20322 | 0.23538 | 64 | 0.20833 | 0.25781 | 14 | 0.14286 | 0.27381 |
| 163 | 0.22802 | 0.21779 | 113 | 0.20501 | 0.23746 | 63 | 0.20899 | 0.26190 | 13 | 0.14103 | 0.29487 |
| 162 | 0.22942 | 0.21811 | 112 | 0.20685 | 0.23958 | 62 | 0.20430 | 0.26613 | 12 | 0.15278 | 0.31944 |
| 161 | 0.23085 | 0.21843 | 111 | 0.20871 | 0.23724 | 61 | 0.19945 | 0.26776 | 11 | 0.16667 | 0.34848 |
| 160 | 0.22813 | 0.21875 | 110 | 0.21061 | 0.23939 | 60 | 0.20000 | 0.27222 | 10 | 0.18333 | 0.30000 |
| 159 | 0.22851 | 0.22013 | 109 | 0.21254 | 0.23853 | 59 | 0.20339 | 0.27684 | 9 | 0.11111 | 0.31481 |
| 158 | 0.22679 | 0.22152 | 108 | 0.21451 | 0.23920 | 58 | 0.19828 | 0.28161 | | | |
| 157 | 0.22611 | 0.22081 | 107 | 0.21651 | 0.23988 | 57 | 0.19883 | 0.28363 | | | |
| 156 | 0.22756 | 0.22222 | 106 | 0.21698 | 0.23742 | 56 | 0.19940 | 0.27976 | | | |
| 155 | 0.22581 | 0.22366 | 105 | 0.21111 | 0.23333 | 55 | 0.19091 | 0.27879 | | | |
| 154 | 0.22511 | 0.22403 | 104 | 0.20994 | 0.23397 | 54 | 0.19136 | 0.27778 | | | |
| 153 | 0.22658 | 0.22440 | 103 | 0.21197 | 0.23625 | 53 | 0.19497 | 0.26415 | | | |
| 152 | 0.22149 | 0.22588 | 102 | 0.21405 | 0.23693 | 52 | 0.19231 | 0.26603 | | | |
| 151 | 0.21965 | 0.22737 | 101 | 0.21287 | 0.23267 | 51 | 0.19608 | 0.27124 | | | |

FIG. 7B

| K | EXISTING | DISCLOSURE | K | EXISTING | DISCLOSURE | K | EXISTING | DISCLOSURE | K | EXISTING | DISCLOSURE |
|---|---|---|---|---|---|---|---|---|---|---|---|
| 200 | 0.21833 | 0.21833 | 150 | 0.22000 | 0.22222 | 100 | 0.21500 | 0.23667 | 50 | 0.19000 | 0.27000 |
| 199 | 0.21859 | 0.21859 | 149 | 0.21700 | 0.22260 | 99 | 0.21717 | 0.23906 | 49 | 0.17347 | 0.27551 |
| 198 | 0.21886 | 0.21886 | 148 | 0.21171 | 0.22297 | 98 | 0.21939 | 0.24150 | 48 | 0.17014 | 0.27431 |
| 197 | 0.21658 | 0.21658 | 147 | 0.21202 | 0.22109 | 97 | 0.21993 | 0.23540 | 47 | 0.17376 | 0.26950 |
| 196 | 0.21684 | 0.21684 | 146 | 0.20890 | 0.22260 | 96 | 0.21354 | 0.23785 | 46 | 0.16667 | 0.27536 |
| 195 | 0.21709 | 0.21709 | 145 | 0.20690 | 0.22414 | 95 | 0.21404 | 0.24035 | 45 | 0.14815 | 0.28148 |
| 194 | 0.21821 | 0.21821 | 144 | 0.20718 | 0.22454 | 94 | 0.21454 | 0.23227 | 44 | 0.14773 | 0.28030 |
| 193 | 0.21934 | 0.21934 | 143 | 0.20396 | 0.22494 | 93 | 0.21685 | 0.23477 | 43 | 0.13953 | 0.28682 |
| 192 | 0.22049 | 0.22049 | 142 | 0.19836 | 0.22653 | 92 | 0.21920 | 0.23732 | 42 | 0.13492 | 0.29365 |
| 191 | 0.22164 | 0.22164 | 141 | 0.19858 | 0.22459 | 91 | 0.22161 | 0.23810 | 41 | 0.13821 | 0.30081 |
| 190 | 0.22281 | 0.22281 | 140 | 0.20000 | 0.22500 | 90 | 0.22222 | 0.24074 | 40 | 0.14167 | 0.30833 |
| 189 | 0.22399 | 0.22399 | 139 | 0.20144 | 0.22662 | 89 | 0.22097 | 0.24345 | 39 | 0.14530 | 0.31197 |
| 188 | 0.22340 | 0.22340 | 138 | 0.20169 | 0.22585 | 88 | 0.22348 | 0.24621 | 38 | 0.14912 | 0.32018 |
| 187 | 0.22460 | 0.22460 | 137 | 0.20195 | 0.22628 | 87 | 0.22605 | 0.24330 | 37 | 0.14865 | 0.32883 |
| 186 | 0.22491 | 0.22491 | 136 | 0.20343 | 0.22672 | 86 | 0.22481 | 0.24225 | 36 | 0.15278 | 0.33796 |
| 185 | 0.22613 | 0.22613 | 135 | 0.20370 | 0.22840 | 85 | 0.22745 | 0.23529 | 35 | 0.15238 | 0.33810 |
| 184 | 0.22373 | 0.22373 | 134 | 0.20522 | 0.22512 | 84 | 0.23016 | 0.23810 | 34 | 0.15196 | 0.34804 |
| 183 | 0.22404 | 0.22404 | 133 | 0.20050 | 0.22431 | 83 | 0.22088 | 0.23896 | 33 | 0.14646 | 0.35354 |
| 182 | 0.22527 | 0.22527 | 132 | 0.20076 | 0.22601 | 82 | 0.21748 | 0.24187 | 32 | 0.15104 | 0.34896 |
| 181 | 0.22284 | 0.22376 | 131 | 0.19975 | 0.22774 | 81 | 0.21811 | 0.23251 | 31 | 0.15591 | 0.34409 |
| 180 | 0.22315 | 0.22407 | 130 | 0.20128 | 0.22692 | 80 | 0.21250 | 0.23542 | 30 | 0.16111 | 0.35000 |
| 179 | 0.22439 | 0.22533 | 129 | 0.20155 | 0.22739 | 79 | 0.21097 | 0.23840 | 29 | 0.16667 | 0.34483 |
| 178 | 0.22004 | 0.22378 | 128 | 0.20313 | 0.22656 | 78 | 0.21368 | 0.23932 | 28 | 0.14881 | 0.35714 |
| 177 | 0.22034 | 0.22411 | 127 | 0.20472 | 0.22703 | 77 | 0.20996 | 0.24242 | 27 | 0.14815 | 0.36420 |
| 176 | 0.22064 | 0.22443 | 126 | 0.20635 | 0.22884 | 76 | 0.20614 | 0.24561 | 26 | 0.15385 | 0.37179 |
| 175 | 0.22190 | 0.22571 | 125 | 0.20667 | 0.22933 | 75 | 0.20444 | 0.24889 | 25 | 0.16000 | 0.38667 |
| 174 | 0.22222 | 0.22605 | 124 | 0.20833 | 0.22581 | 74 | 0.20721 | 0.25225 | 24 | 0.15972 | 0.39583 |
| 173 | 0.22254 | 0.22640 | 123 | 0.20732 | 0.22629 | 73 | 0.21005 | 0.25571 | 23 | 0.14493 | 0.41304 |
| 172 | 0.22287 | 0.22674 | 122 | 0.20902 | 0.22541 | 72 | 0.21296 | 0.25926 | 22 | 0.14394 | 0.43182 |
| 171 | 0.22320 | 0.22710 | 121 | 0.20937 | 0.22590 | 71 | 0.21596 | 0.26056 | 21 | 0.15079 | 0.43651 |
| 170 | 0.22353 | 0.22745 | 120 | 0.20556 | 0.22778 | 70 | 0.21667 | 0.26190 | 20 | 0.15833 | 0.40833 |
| 169 | 0.22387 | 0.22781 | 119 | 0.20308 | 0.22969 | 69 | 0.21981 | 0.26329 | 19 | 0.16667 | 0.39474 |
| 168 | 0.22520 | 0.22917 | 118 | 0.20339 | 0.23164 | 68 | 0.21814 | 0.26471 | 18 | 0.12963 | 0.41667 |
| 167 | 0.22655 | 0.23054 | 117 | 0.20228 | 0.23219 | 67 | 0.22139 | 0.25871 | 17 | 0.12745 | 0.43137 |
| 166 | 0.22791 | 0.23193 | 116 | 0.20402 | 0.23420 | 66 | 0.22475 | 0.26263 | 16 | 0.13542 | 0.39583 |
| 165 | 0.22727 | 0.23131 | 115 | 0.20435 | 0.23623 | 65 | 0.21282 | 0.26667 | 15 | 0.14444 | 0.35556 |
| 164 | 0.22866 | 0.23272 | 114 | 0.20322 | 0.23538 | 64 | 0.20833 | 0.26563 | 14 | 0.14286 | 0.34524 |
| 163 | 0.22802 | 0.23211 | 113 | 0.20501 | 0.23746 | 63 | 0.20899 | 0.26720 | 13 | 0.14103 | 0.32051 |
| 162 | 0.22942 | 0.23354 | 112 | 0.20685 | 0.23958 | 62 | 0.20430 | 0.27151 | 12 | 0.15278 | 0.34722 |
| 161 | 0.23085 | 0.23499 | 111 | 0.20871 | 0.23724 | 61 | 0.19945 | 0.27596 | 11 | 0.16667 | 0.36364 |
| 160 | 0.22813 | 0.23333 | 110 | 0.21061 | 0.23939 | 60 | 0.20000 | 0.28056 | 10 | 0.18333 | 0.38333 |
| 159 | 0.22851 | 0.23375 | 109 | 0.21254 | 0.23853 | 59 | 0.20339 | 0.28249 | 9 | 0.11111 | 0.31481 |
| 158 | 0.22679 | 0.22890 | 108 | 0.21451 | 0.23920 | 58 | 0.19828 | 0.28736 | | | |
| 157 | 0.22611 | 0.22824 | 107 | 0.21651 | 0.23988 | 57 | 0.19883 | 0.29240 | | | |
| 156 | 0.22756 | 0.22970 | 106 | 0.21698 | 0.23742 | 56 | 0.19940 | 0.28869 | | | |
| 155 | 0.22581 | 0.22581 | 105 | 0.21111 | 0.23333 | 55 | 0.19091 | 0.28788 | | | |
| 154 | 0.22511 | 0.22511 | 104 | 0.20994 | 0.23397 | 54 | 0.19136 | 0.28704 | | | |
| 153 | 0.22658 | 0.22658 | 103 | 0.21197 | 0.23625 | 53 | 0.19497 | 0.27358 | | | |
| 152 | 0.22149 | 0.22478 | 102 | 0.21405 | 0.23693 | 52 | 0.19231 | 0.27885 | | | |
| 151 | 0.21965 | 0.21965 | 101 | 0.21287 | 0.23267 | 51 | 0.19608 | 0.28431 | | | |

DATA INTERLEAVING DEVICE AND METHOD IN WIRELESS COMMUNICATION SYSTEM USING POLAR CODE

CROSS-REFERENCE TO RELATED APPLICATIONS

This application is a 371 of International Application No. PCT/KR2018/008556 filed on Jul. 27, 2018, which claims priority to Korean Patent Application No. 10-2017-0100583 filed on Aug. 8, 2017, the disclosures of which are herein incorporated by reference in their entireties.

BACKGROUND

1. Field

The disclosure relates to an interleaving device and method for connecting, when using cyclic redundancy check (CRC) bits to detect whether there is an error in information bits decoded from a signal transmitted from a transmitter to a receiver in a communication system using a polar code, the information bits and the CRC bits. In addition, in the disclosure, a method of designing an interleaver will be described.

2. Description of Related Art

In order to meet wireless data traffic demands that have increased after 4G communication system commercialization, efforts to develop an improved 5G communication system or a pre-5G communication system have been made. For this reason, the 5G communication system or the pre-5G communication system is called a beyond 4G network communication system or a post LTE system. In order to achieve a high data transmission rate, an implementation of the 5G communication system in a mmWave band (for example, 60 GHz band) is being considered. In the 5G communication system, technologies such as beamforming, massive MIMO, Full Dimensional MIMO (FD-MIMO), array antenna, analog beam-forming, and large scale antenna are being discussed as means to mitigate a propagation path loss in the mm Wave band and increase a propagation transmission distance. Further, the 5G communication system has developed technologies such as an evolved small cell, an advanced small cell, a cloud Radio Access Network (RAN), an ultra-dense network, Device to Device communication (D2D), a wireless backhaul, a moving network, cooperative communication, Coordinated Multi-Points (CoMP), and received interference cancellation to improve the system network. In addition, the 5G system has developed Advanced Coding Modulation (ACM) schemes such as Hybrid FSK and QAM Modulation (FQAM) and Sliding Window Superposition Coding (SWSC), and advanced access technologies such as Filter Bank Multi Carrier (FBMC), Non Orthogonal Multiple Access (NOMA), and Sparse Code Multiple Access (SCMA).

Meanwhile, the Internet has been evolved to an Internet of Things (IoT) network in which distributed components such as objects exchange and process information from a human-oriented connection network in which humans generate and consume information. An Internet of Everything (IoE) technology in which a big data processing technology through a connection with a cloud server or the like is combined with the IoT technology has emerged. In order to implement IoT, technical factors such as a sensing technique, wired/wireless communication, network infrastructure, service-interface technology, and security technology are required, and research on technologies such as a sensor network, Machine-to-Machine (M2M) communication, Machine-Type Communication (MTC), and the like for connection between objects has recently been conducted. In an IoT environment, through collection and analysis of data generated in connected objects, an intelligent Internet Technology (IT) service to create a new value for peoples' lives may be provided. The IoT may be applied to fields such as those of a smart home, a smart building, a smart city, a smart car, a connected car, a smart grid, health care, a smart home appliance, or high-tech medical services through the convergence of the conventional Information Technology (IT) and various industries.

Accordingly, various attempts to apply the 5G communication to the IoT network are made. For example, technologies such as a sensor network, Machine to Machine (M2M), and Machine Type Communication (MTC) are implemented by beamforming, MIMO, and array antenna schemes. The application of a cloud RAN as the big data processing technology may be an example of convergence of the 5G technology and the IoT technology.

On the other hand, techniques for early termination of the decoding of a polar code using a distributed cyclic redundancy check (CRC) have been proposed through 3GPP contributions R1-1708833, R1-1711539, and the like. Fundamentally, the corresponding CRC is generated on the basis of information bits, and the information bits and CRC bits are passed through an interleaver to distribute the CRC rather than directly connecting the information bits and the CRC bits. Thereafter, a codeword is generated and modulated through an encoder of the pole code to transmit a signal. A receiver performs a general decoding process of the polar code, in which distributed CRC bits can be used to check whether an intermediate result of the decoding is correct, thereby enabling early termination. After the decoding of the polar code is completed, the decoded polar code is passed through a deinterleaver to restore an original information bit order.

The core of this distributed CRC is the interleaving technology, and a complexity reduction gain at the early termination is determined depending on the design of the interleaver. The design of the interleaver depends on the shape of the parity portion of the generation matrix of the CRC codes, and the shape of the generation matrix varies depending on the number of information bits. In the prior art, a single interleaving/deinterleaving pattern is found on the basis of the maximum number of information bits considered in a system, and an interleaver is implemented by nulling the location of missing information bits while the corresponding interleaver/deinterleaver is used for the number of information bits below the maximum number of information bits. The corresponding block diagrams and examples are shown in FIGS. 1 and 2.

Referring to FIG. 1, data to be transmitted, that is, information bits, is input to a CRC generator 101. The CRC generator 101 generates a CRC that is an error correction code by using the data to be transmitted, and outputs the data to be transmitted and the generated CRC. In this case, the length of the CRC may be determined according to the length of the data to be transmitted or requirements of a system to be used. Therefore, the CRC generator 101 adds the generated CRC at the end of the information bits and outputs the corresponding data to an interleaver 103.

The interleaver 103 performs interleaving on the information bits and the CRC together according to a predetermined method. An interleaving pattern optimized for Kmax=200 using CRC-19 with a CRC polynomial of 0xA2B79 in the interleaver 103 is as follows.

| |
|---|
| 1 3 4 5 6 8 11 12 13 16 17 20 21 22 26 27 30 31 32 33 37 39 40 41 42 48 52 54 60 67 68 70 72 73 74 75 79 85 86 88 89 92 93 94 99 100 101 103 104 108 109 110 111 112 113 114 117 123 125 127 128 129 131 135 137 140 141 154 157 162 163 165 167 168 169 176 180 183 186 188 190 191 192 193 194 195 P16 14 15 18 23 25 28 35 36 38 45 55 57 58 61 64 71 82 91 95 96 98 107 116 119 122 126 130 133 136 138 139 142 145 148 151 160 170 171 172 173 174 175 177 178 181 184 187 196 197 199 200 P19 2 7 9 34 43 49 53 69 76 80 87 90 102 105 115 118 124 132 155 158 164 166 189 P15 24 44 47 51 59 62 63 65 77 78 83 120 146 152 156 159 P8 29 56 81 121 144 147 150 161 182 185 198 P3 10 19 97 106 134 P1 46 50 66 84 143 149 153 179 P2 P4 P5 P6 P7 P9 P10 P11 P12 P13 P14 P17 P18 |

The information bits and the CRC interleaved in the interleaver 103 may be mapped to a subchannel through which the bits are to be transmitted by a subchannel mapping and polar encoder 103, may be polar-encoded by the polar encoder, and may then be transmitted to a receiver side. At this time, when the interleaver 103 interleaves the information bits and the CRC, an interleaving operation is performed according to the maximum length of information to be transmitted. Therefore, when information having a maximum length is transmitted, the interleaver 103 does not need to perform a special additional procedure. That is, interleaving may be performed according to an interleaving rule in operation 210.

On the other hand, when the length of the information to be transmitted is shorter than the maximum length, that is, when an amount of data to be transmitted whose length is shorter than the maximum length is transmitted, the interleaver 103 needs an additional operation to interleave information of a short length. Referring to FIG. 2, when the information to be transmitted has a length shorter than the maximum length of the information to be transmitted, that is, when the amount of information is small, the interleaver 103 needs to remove data by the corresponding amount. This will be described with reference to FIG. 2.

In FIG. 2, it is assumed that the numbers 1 to 12 are the positions of consecutive bits to be interleaved, and P1 to P4 may be positions of error correction codes generated by a CRC generator. In FIG. 2, it is assumed that an interleaving unit in the interleaver 103, that is, a length of interleaved data is 12 consecutive bit units. In this case, when the amount of data to be actually transmitted is 10 consecutive bits, there are no 11th and 12th bits in FIG. 2. Accordingly, the interleaver 103 may perform an interleaving operation in operation 210 on the assumption that there are two more bits in consecutive 10-bit data. The 11th position among the consecutive bits interleaved in the interleaver 103 becomes the 11th position as is, and the 12th position moves to the position of P3. However, there is no data to be transmitted in the 11th and 12th positions.

Therefore, since there is no data to be actually transmitted at the interleaved 11th position and the interleaved 14th position (P3 position before being interleaved) in the interleaved bit string in operation 220, the interleaver 103 may perform a removal or nulling operation, thereby reducing the amount of data to be transmitted.

Meanwhile, a polar decoding and early termination determiner 111 of a receiver may decode polar-coded symbols transmitted through each subchannel, and may inspect a CRC to determine the early termination. If there is an error in information received through the subchannel as a result of decoding, that is, decoding is impossible, the polar decoding and early termination determiner 111 may terminate the decoding operation early. On the other hand, when there is no error in the information received through the subchannel, that is, when decoding is possible, the decoded information is output to a deinterleaver 113.

At this time, the deinterleaver 113 is also configured to satisfy the maximum length of data to be transmitted as in the above-described interleaver 103. Accordingly, when the length of information to be transmitted is not the maximum length, the deinterleaver 113 may perform deinterleaving by considering information corresponding to null. That is, the deinterleaver 113 may perform deinterleaving in consideration of the position that has been subjected to removal or nulling in the interleaver, as in operation 220, among the information output from the polar decoding and the early termination determiner 111.

Thereafter, the deinterleaver 113 outputs corresponding data to a CRC inspector 115 when deinterleaving is completed as above. The CRC inspector 115 may detect a CRC included in the deinterleaved information and may finally determine whether the entire information is defective by performing CRC inspection.

The prior art described above corresponds to a case where only the maximum number of information bits is considered in designing a single interleaver/deinterleaver. Therefore, in designing the single interleaver/deinterleaver, a gain for reducing the computational complexity is maximized. However, this method does not guarantee that it is optimal for a case in which the number of other information bits, that is, the number of information bits, is not a maximum value. In particular, when the number of information bits is small, a computational complexity reduction gain is greatly reduced.

Accordingly, the disclosure provides an interleaver/deinterleaver design for CRC that can improve a computational complexity reduction gain for the number of all information bits considered in a system, and a data transmission/reception method and apparatus using the same. While the prior art uses a single interleaving/deinterleaving pattern, in the disclosure, there is a possibility of using a plurality of patterns and only the maximum value of the number of information bits is not considered in designing an interleaving pattern.

SUMMARY

In accordance with an aspect of the disclosure, a data transmission apparatus in a wireless communication system using a polar code may include: an error detection information generator configured to generate error detection bits to correspond to a length of a series of information bits to be transmitted; a multi-interleaver configured to perform interleaving to correspond to a sum of the length of the generated error detection bits and the length of the information bits; a mapping and polar encoder configured to map the multi-interleaved information to a subchannel and to polar-encode the mapped information; and a transceiver configured to transmit the polar-encoded data to the subchannel, wherein the multi-interleaver includes:

two or more constituent interleavers configured to perform interleaving in different schemes to correspond to the sum of the length of the generated error detection bits and the length of the information bits; an input switch configured to perform switching so that the generated error detection bits and the information bits are input to one of the two or more constituent interleavers; and an output switch configured to output a transmission bit string interleaved in one of the two or more constituent interleavers, and wherein each of the constituent interleavers fills remaining spaces with nulls before interleaving when the length of the information bits is smaller than a maximum length, and interleaving is performed so that at least one of the generated error detection bits is located between the information bits.

In accordance with another aspect of the disclosure, a data transmission method in a wireless communication system using a polar code may include: generating error detection bits to correspond to a length of a series of information bits to be transmitted; performing interleaving to correspond to a sum of the length of the generated error detection bits and the length of the information bits; mapping the interleaved information to a subchannel; polar-encoding the interleaved information mapped to the subchannel; and transmitting the polar-encoded data to the subchannel, wherein the interleaver:

performs interleaving in different methods to correspond to the sum of the length of the generated error detection bits and the length of the information bits, and wherein each of the interleaving operations fills remaining spaces with nulls before interleaving when the length of the information bits is smaller than a maximum length, and interleaving is performed so that at least one of the generated error detection bits is located between the information bits.

In accordance with another aspect of the disclosure, a data reception apparatus in a wireless communication system using a polar code may include: a transceiver configured to receive, from a wireless channel, configuration information of a polar code and data polar-encoded and transmitted to a predetermined subchannel; a polar code decoder configured to generate a parity check matrix on the basis of the configuration information of the polar code and to decode the polar-encoded data using the parity check matrix; a multi-deinterleaver configured to perform deinterleaving according to an output length of the polar encoder; and an error inspector configured to perform error inspection using the output of the multi-deinterleaver, wherein the multi-deinterleaver includes:

two or more constituent deinterleavers configured to perform deinterleaving in different schemes on the basis of the configuration information of the polar code; an input switch configured to connect the polar encoder to one of the two or more constituent deinterleavers; and an output switch configured to output a transmission bit string deinterleaved in one of the two or more constituent deinterleavers to the error inspector, and wherein the polar decoder generates a parity check matrix using an error detection bit-generation polynomial, an interleaver, and the length of a received input bit on the basis of the configuration information of the polar code, sequentially performs polar-decoding on the basis of the generated parity check metric, determines a reception error of polar-encoded data by comparing a linear combination value for a decoding result value of preceding bits with parity bits when the parity bits are decoded, and terminates the polar-encoded information early when the reception error of the polar-encoded data exists.

In accordance with another aspect of the disclosure, a data reception method in a wireless communication system using a polar code may include: receiving configuration information of a polar code from a wireless channel; receiving data polar-encoded and transmitted to a predetermined subchannel; generating a parity check matrix on the basis of the configuration information of the polar code and decoding the polar-encoded data using the parity check matrix; performing deinterleaving according to an output length of a polar encoder; and performing error inspection using the output of the multi-deinterleaver, wherein deinterleaving is performed in two or more different schemes on the basis of the configuration information of the polar code at the time of deinterleaving, and wherein the decoding of the polar code generates a parity check matrix using an error detection bit-generation polynomial, an interleaver, and the length of a received input bit on the basis of the configuration information of the polar code, sequentially performs polar-decoding on the basis of the generated parity check metric, determines a reception error of polar-encoded data by comparing a linear combination value for a decoding result value of preceding bits with parity bits when the parity bits are decoded, and terminates the polar-encoded information early when the reception error of the polar-encoded data exists.

According to the disclosure, it is possible to design an interleaver having a faster early termination gain than a known interleaver design method.

BRIEF DESCRIPTION OF THE DRAWINGS

FIG. 5 is a diagram illustrating a CRC matrix according to an embodiment.

FIG. 6A is a diagram illustrating a DCRC according to an embodiment.

FIG. 6B is a diagram illustrating a matrix obtained through proper row interleaving according to an embodiment.

FIGS. 7A and 7B are diagrams illustrating effects of the disclosure according to an embodiment.

DETAILED DESCRIPTION

As described above, as to the wireless communication system, research and technology development of 5G networks for higher speed data transmission is underway. In a 5G wireless network, a method of transmitting control information using a polar code is discussed. In addition, in the 5G network, a case in which mass connectivity such as mMTC and low latency data such as URLLC needs to be transmitted may occur. Thus, in case of mMTC, a power issue can occur because a receiver has to decode many signals simultaneously. Accordingly, if a control signal or other data to be transmitted can be subjected to early termination (ET), that is, if an ET gain is large, the reception power can be reduced.

In addition, in case of URLLC (low latency), the decoding delay of a control signal can be reduced according to the purpose of the URLLC. Therefore, if the ET gain is large, the average delay may be reduced to support the stable operation of a URLLC terminal.

The disclosure discloses a method and apparatus of implementing a distributed CRC to support early termination of polar code decoding and the like. The distributed CRC is implemented by passing information bits and CRC bits through an interleaver. In this disclosure, a structure using different types of interleavers depending on the number of information bits K is proposed.

Figure 1:
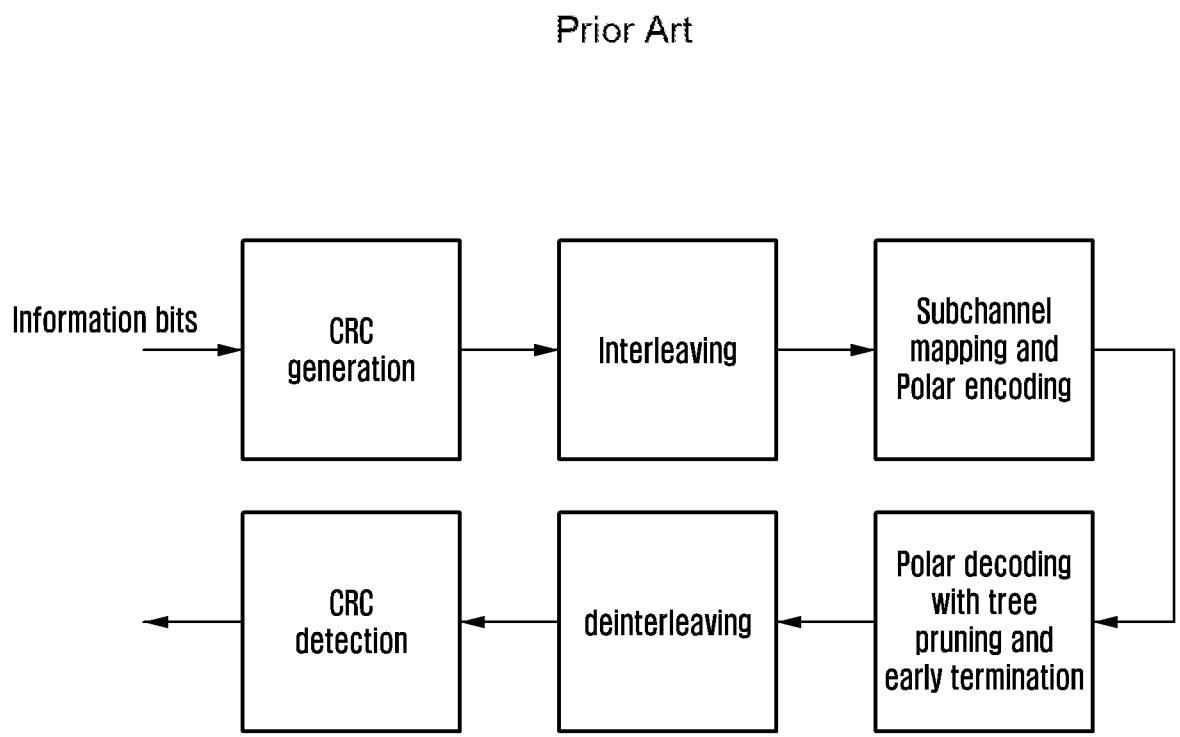
FIG. 1 is a block diagram illustrating a structure of each of an interleaver and a deinterleaver.
Figure 2:
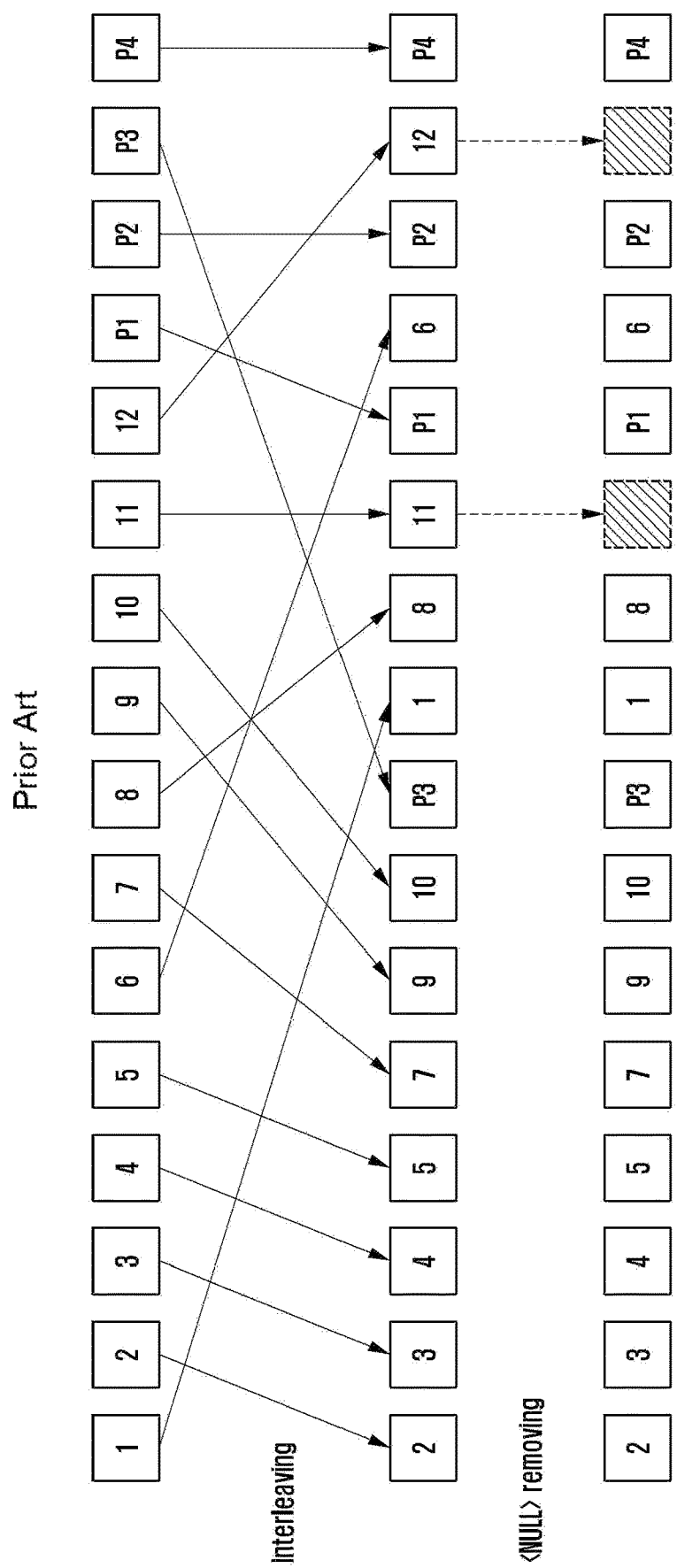
FIG. 2 is a diagram illustrating an example of a method of implementing an interleaver.
Figure 3:
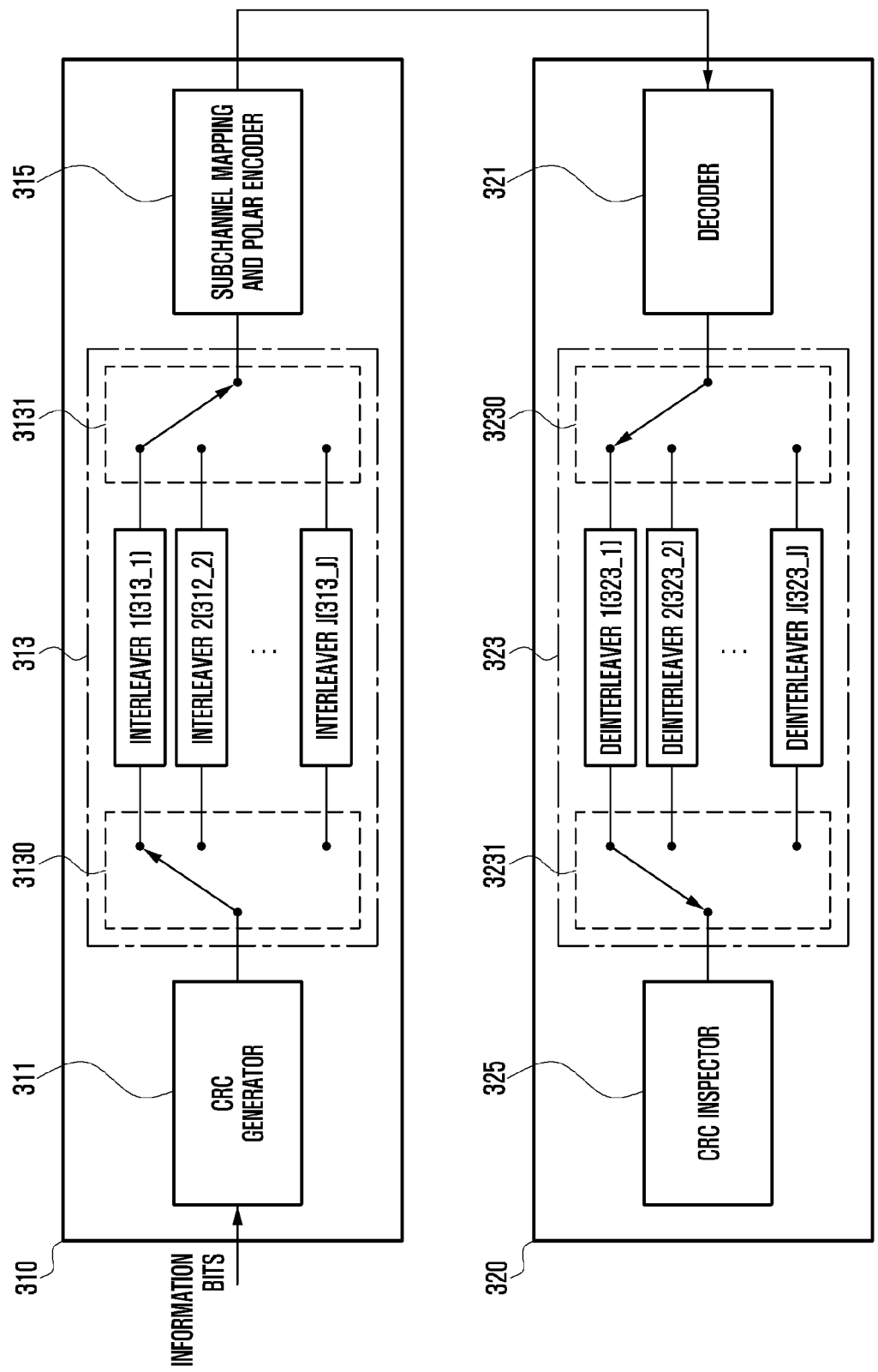
FIG. 3 is a diagram illustrating a structure using different types of interleavers depending on the number of information bits.

Referring to FIG. 3, when it is assumed that the minimum value and the maximum value of the number of input information bits are Kmin and Kmax, in the disclosure, all sections, that is, data to be transmitted is divided into j sections according to the length, and a different interleaver is applied to K corresponding to each section. Also, a method of determining each interleaver and a range of a corresponding K in a multi-interleaver structure according to the disclosure is disclosed. Here, j is an arbitrary integer of 1 or more, and thus, the disclosure also includes the design of a single interleaver. An improved early termination gain can be obtained from this multi-interleaver structure.

First, the operation order of a polar code transceiver including the multi-interleaver according to the disclosure is illustrated in Table 1 below.

TABLE 1

1) CRC bits are generated while having input information bits
2) i-th section satisfying $Kmin_i < = K < = Kmax_i$, for the number K of input information bits and corresponding interleaver i are found
3) Portion in which index is more than K and less than or equal to $Kmax_i$ in pattern of interleaver i is filled with null and then information bits and CRC bits are passed through interleaver i
4) In case where early termination is not performed while polar encoding/decoding is performed, $Kmax_i$-K-numbered nulls are inserted into decoded information bits and CRC bits and passed through deinterleaver i
5) CRC inspection is performed on information bits and CRC bits passed through deinterleaver The operation order of the multi-interleaver and a deinterleaving method of a symbol transmitted through a subchannel and received at a receiver are shown in Table 1 above.

FIG. 3 is a system diagram illustrating the structure of a multi-interleaver and a multi-deinterleaver.

Referring to FIG. 3, the structure may include a transmitter 310 and a receiver 320.

First, the transmitter 310 may include a CRC generator 311, a multi-interleaver 313, and a subchannel mapping and polar encoder 315. In addition, although not shown in FIG. 3, a transmission/reception processor that transmits corresponding data through a subchannel may be included.

The multi-interleaver 313 may include a plurality of constituent interleavers 313_1, 313_2, . . . , and 313_j for interleaving a variety of types of information of different lengths. The respective constituent interleavers 313_1, 313_2, . . . , and 313_j are interleavers for interleaving information bits with different lengths and CRC bits generated to correspond to the information bits. Accordingly, the multi-interleaver 313 may include an input switch 3130 for selecting a specific constituent interleaver for performing interleaving according to the length of each bit output from the CRC bit generator 313 and an output switch 3131 for outputting the bits interleaved by a specific interleaver.

Then, the operation according to the component of the transmitter 310 will be described first.

In addition, although not illustrated in FIG. 3, a controller of the transmitter 310 may be included. Such a controller may include one processor or two or more processors, may include a circuit for control, or may include a memory and a processor in the form of a program. For example, when the transmitter 310 is included in a base station, the controller of the transmitter 310 may be one processor that performs control of the base station. Conversely, when the transmitter 310 is a terminal that performs wireless communication, the controller of the transmitter 310 may be an AP or a CP that performs control of the terminal, or may include a processor for controlling the operation according to a combination of the AP and the CP or performing a separate control. A method of configuring the controller of the transmitter 310 as the processor may use one of the methods well-known in the art, and thus, a detailed description thereof will be omitted.

The information bits may be specific data to be transmitted by the controller of the transmitter 310. Therefore, the controller of the transmitter 310 inputs the information bits into the CRC generator 311. The CRC bit generator 311 generates a CRC to be added to data to be transmitted, and outputs the data to be transmitted and the CRC. The operation of the CRC bit generator 311 may be controlled by the controller of the transmitter 310 or simply driven by the triggering of the controller of the transmitter 310. In addition, the length of the CRC may be determined depending on the length of the data to be transmitted and/or the requirements of a used system. The CRC bit generator 311 adds the generated CRC to the distal end of the information bits on the basis of a predetermined method and outputs the corresponding data to the multi-interleaver 313.

As described above, the multi-interleaver 313 may include one or more constituent interleavers for performing interleaving in different ways according to the information length including the CRC. Accordingly, the bits output from the CRC bit generator 311 may be input to a specific interleaver through the input switch 3130 included in the multi-interleaver 311. For example, it is assumed that a first interleaver 313_1 is a constituent interleaver that interleaves bits of a-length or more and less than b-length, which corresponds to the shortest section, a second interleaver 313_2 is a constituent interleaver that interleaves bits of b-length or more and less than c-length, and a j-th interleaver 313_j is a constituent interleaver that interleaves bits of i-length or more and less than p-length.

Since the controller of the transmitter 310 knows information to be transmitted and the length of the CRC in advance, the constituent interleaver to which the input switch 3130 of the multi-interleaver 313 should be connected may be determined in advance. If the constituent interleaver corresponds to the shortest length section, the controller of the transmitter 310 may control the input switch 3130 to be connected to the first interleaver 313_1. In the same manner, the controller of the transmitter 310 may control the input switch 3130 to be connected to the second interleaver 313_2 or the j-th interleaver 313_j according to the information to be transmitted and the length of the CRC.

Accordingly, the controller of the transmitter 310 may control the switching such that bits output from the CRC bit generator 311 are input to the interleaver corresponding to the corresponding length by controlling the input switch 3130 of the multi-interleaver 313. The controller of the transmitter 310 may also control or trigger a particular constituent interleaver in the multi-interleaver 313 to perform an interleaving operation. In addition, the controller of the transmitter 310 may control the output switch 3131 in the multi-interleaver 313 so that the corresponding constituent interleaver having performed interleaving outputs the interleaved bits to the subchannel mapping and polar encoder 315.

The interleaving operation of each constituent interleaver included in the multi-interleaver 313 will be further described with reference to the accompanying drawings.

The bits interleaved and output by the multi-interleaver 313 are mapped to a subchannel through which the bits are to be transmitted by the subchannel mapping and the polar encoder 315, are polar-encoded by the polar encoder, and then are transmitted to the receiver side.

Next, the receiver 320 may include a decoder 321, a multi-deinterleaver 323, and a CRC inspector 325. In addition, although not illustrated in FIG. 3, the receiver 320 may include a transceiver that performs band-down-conversion into a band capable of receiving and processing a signal transmitted through a wireless channel from a transmitter.

The multi-deinterleaver 323 may include a plurality of component deinterleavers 323_1, 323_2, . . . , and 323_j for interleaving a variety of types of information having different lengths. Each of the deinterleavers 323_1, 323_2, . . . , and 323_j deinterleaves transmitted and decoded bits having different lengths. Accordingly, the multi-deinterleaver 323 may include an input switch 3230 for selecting a specific component deinterleaver for performing deinterleaving according to the length of the bits output from the decoder 321 and an output switch 3231 for outputting the bits deinterleaved in a corresponding specific deinterleaver to the CRC inspector 325.

In addition, although not illustrated in FIG. 3, a controller of the receiver 320 may be included. Such a controller may include one processor or two or more processors, may include a circuit for control, or may include a memory and a processor in the form of a program. For example, when the receiver 320 is included in a base station, the controller of the receiver 320 may be one processor that performs control of the base station. Conversely, when the receiver 320 is a terminal that performs wireless communication, the controller of the receiver 320 may be an AP or a CP that performs control of the terminal, or may include a processor for controlling the operation according to a combination of the AP and the CP or performing a separate control. A method of configuring the controller of the receiver 320 as the processor may use one of the methods well-known in the art, and thus, a detailed description thereof will be omitted.

Next, the operation according to the component of the receiver 320 will be described.

First, it is assumed that the receiver 320 is a terminal of a wireless communication system. In this case, a base station, which is a transmitter, may previously provide configuration information of information bits transmitted from the transmitter 310, that is, the configuration of a polar code, using system information, another broadcast channel, higher layer signaling, or the like. Therefore, the receiver 320 is in a state in which it has previously acquired information on the configuration of the polar code. Here, the configuration information of the polar code may be information of "payload+CRC length" as input data of an encoder included in the transmitter 310. Accordingly, the receiver 320 may select a DCRC interleaver.

First, a polar decoding operation will be described in consideration of the selected DCRC interleaver.

The polar decoding operation first configures a parity check matrix according to a CRC polynomial and the input bit length of the selected deinterleaver and decoder. Next, sequential polar decoding operations may be performed on the basis of the configured parity check metric. In this case, when the DCRC parity bit is decoded, it is possible to determine whether early termination is performed by comparing a DCRC bit value with a linear combination of the decoding result values of the preceding bits.

The above-described operation will be described again with reference to FIG. 3. Polar-encoded symbols received through the subchannel may be input to the decoder 321 and may be decoded in the above-described method. In addition, when the CRC parity bits are decoded while the symbols received by the control of the controller (not shown in FIG. 3) of the receiver are decoded, the decoder 321 compares the DCRC bit value with the linear combination of the decoding result values of the preceding bits and provides the early terminated or decoded information to the multi-deinterleaver 323. If early termination is performed, the decoding of the symbol received at the decoder 321 fails, and if the decoding of the symbol received at the decoder 321 is successful, the decoder 321 provides the decoded data to the multi-deinterleaver 323.

The multi-deinterleaver 323 may control the input switch 3230 according to the length of the decoded data and provide corresponding data to the corresponding deinterleaver. The multi-deinterleaver 323 may include the same number of component deinterleavers as the number of constituent interleavers included in the multi-interleaver 313. This is because the deinterleaver performs deinterleaving in the reverse of the interleaved manner. Therefore, the number of component deinterleavers included in the multi-deinterleaver 323 is equal to the number of constituent interleavers of the multi-interleaver.

Therefore, the same number of component deinterleavers 323_1, 323_2, . . . , and 323_j as the number of the above-described constituent interleavers may be included in the multi-deinterleaver 323. Thus, for example, it is assumed that a first deinterleaver 323_1 is a component deinterleaver that deinterleaves bits of a-length or more and less than b-length, which corresponds to the shortest section, a second deinterleaver 323_2 is a constituent interleaver that deinterleaves bits of b-length or more and less than c-length, and a j-th interleaver 313_j is a constituent interleaver that deinterleaves bits of i-length or more and less than p-length.

Since the controller of the receiver 320 knows the length of decoded information in advance, the component deinterleaver to which the input switch 3230 of the multi-deinterleaver 323 should be connected may be determined in advance. If the component deinterleaver corresponds to the shortest length section, the controller of the receiver 320 may control the input switch 3230 to be connected to the first deinterleaver 323_1. In the same manner, the controller of the receiver 320 may control the input switch 3230 to be connected to the second deinterleaver 323_2 or the j-th deinterleaver 323_j according to the length of the decoded information.

Accordingly, the controller of the receiver 320 may control the switching such that bits output from the decoder 321 are input to the component deinterleaver corresponding to the corresponding length by controlling the input switch 3230 of the multi-deinterleaver 323. The controller of receiver 320 may also control or trigger a particular component deinterleaver in the multi-deinterleaver 323 to perform an interleaving operation. In addition, the controller of the receiver 320 may control the output switch 3231 in the multi-deinterleaver 323 so that the corresponding component deinterleaver having performed deinterleaving outputs the deinterleaved bits to the CRC inspector 325.

As described above, the deinterleaving operation of each component deinterleaver included in the multi-deinterleaver 323 has only one deinterleaving operation. Therefore, the interleaved data is deinterleaved in one of the component deinterleavers 323_1, 323_2, . . . , and 323_j and may be restored in the original data order. That is, they are rearranged in the order of the bit strings before being interleaved in the interleaver of the transmitter 310. In addition, each component deinterleaver 323_1, 323_2, . . . , and 323_j may relocate the position of the CRC to a position after the position of the information bit.

The bits deinterleaved and output from the multi-deinterleaver 313 are input to the CRC inspector 325. The CRC inspector 325 may detect the CRC included in the deinterleaved information and may inspect the detected CRC to finally determine whether the entire information is defective. Accordingly, data without a defect can be provided to the controller or the application program of a processor. On the other hand, if a defect exists, corresponding data may be discarded or replaced by retransmitted information according to the specification of the wireless communication system.

Figure 4:
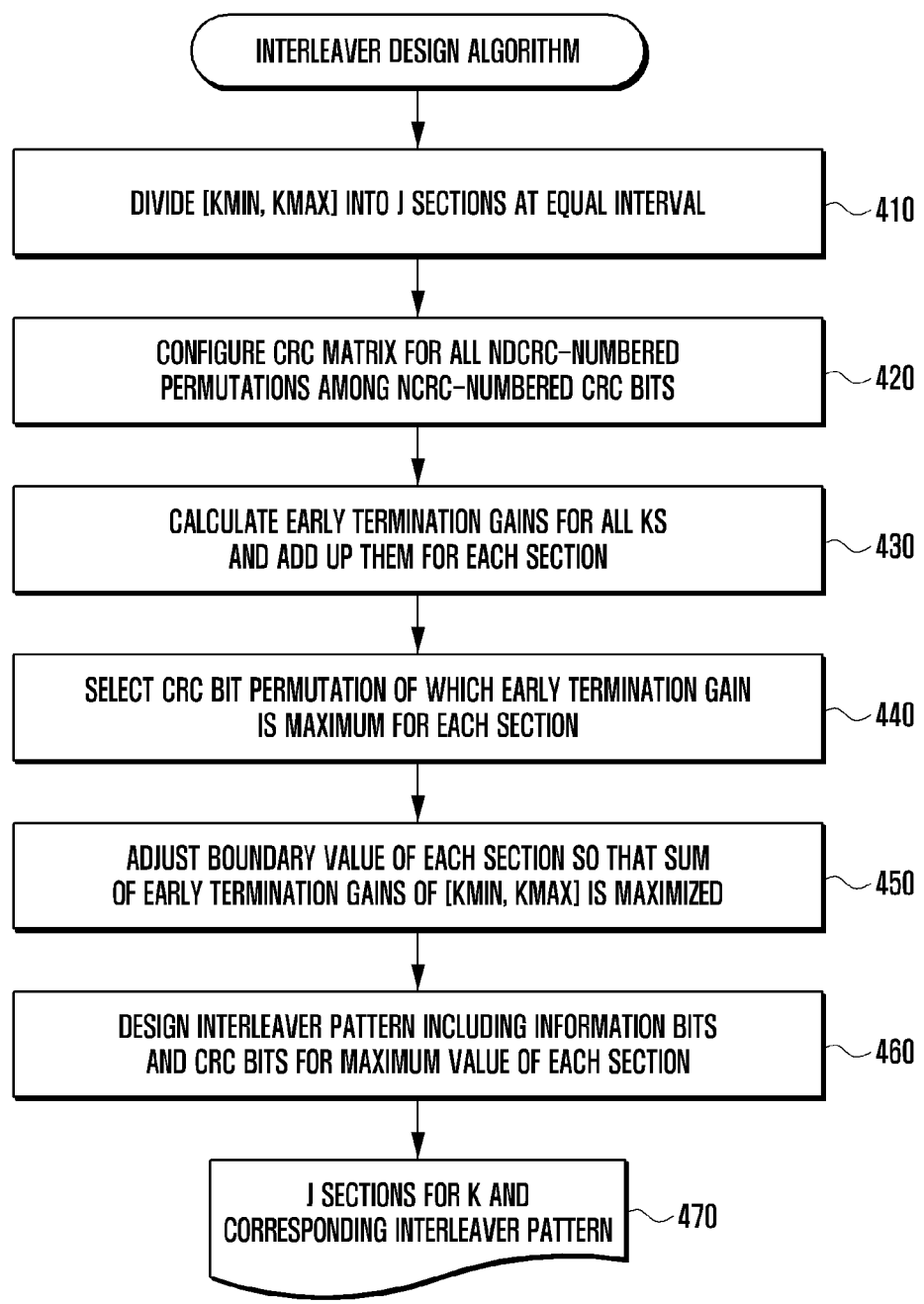
FIG. 4 is a diagram illustrating an interleaver design method according to an embodiment.

FIG. 4 is a flowchart illustrating an interleaver design method according to an embodiment.

Before referring to FIG. 4, the relationship between an interleaver and a deinterleaver will be briefly described. The design of the deinterleaver is obvious and unique from the designed interleaver. Thus, since the deinterleaver is intended to cause the interleaved bits (or symbols, data, or information) to be in reverse order before being interleaved back, detailed descriptions will be omitted. An improved early termination gain can be obtained from the interleaver/deinterleaver design of the disclosure described below.

In addition, the operation of the CRC generator, which is an input of the interleaver, will be described first before describing the interleaver design of FIG. 4. It is assumed that a CRC polynomial is g(x). When nCRC numbered-CRC bits are generated for K information bits, an i-th row of the corresponding CRC generation matrix is coefficients of $x^{\wedge}(nCRC+i-1) \mod g(x)$. Here, i is an integer from 1 to K, and the rows of each matrix are assumed to increase in index from bottom to top. From this assumption, it can be seen that input information bits should be assigned with indices in reverse order.

For example, a CRC matrix in a case where $g(x)=x^{\wedge}4+x^{\wedge}3+1$, K=12, and nCRC=4 is as illustrated in FIG. 5. FIG. 5 is a diagram illustrating an example of a CRC matrix.

The respective CRC bits are represented by P1, P2, P3, and P4. The respective CRC bits are dependent on twelve information bits, and therefore they cannot be used for early termination of polar decoding even though they are placed in the middle when the information bits are arranged sequentially. For reference, g(x) is mostly provided in the form of a primitive polynomial p(x) or (x+1)p(x) of a finite field. It is known that, when g(x) is provided in the form of a primitive polynomial of the finite field in this manner, each column of the CRC matrix becomes a part of m-sequence or complementary m-sequence.

When the information bits are input, the CRC bits are generated through a linear feedback shift register (LFSR) as in a normal system. Normally, the CRC bits are located after the information bits, which cannot support early termination when decoding polar codes. Since the decoding of the polar code is performed sequentially from the beginning of the information bits, some CRC bits should be located in the middle of the information bits to support early termination using the CRC, and each CRC bit should be a bit related only to the preceding information bit.

j interleaver sections derived by the interleaver design algorithm of the disclosure are defined as [Kmin1 (=Kmin), Kmax1], [Kmin2, Kmax2], . . . , and [Kminj, Kmaxj (=Kmax)], and the respective constituent interleavers included in each multi-interleaver are defined as an interleaver 1, . . . , and an interleaver j. Each constituent interleaver is designed for the maximum value in each section, and even though information bits below the maximum value are input, when the corresponding information bit index is subjected to null or removal and interleaved, some CRC bits may be located in the middle of the information bits. Therefore, the interleaving pattern should be carefully designed so that each CRC bit is only associated with the preceding information bit. For example, as illustrated in FIG. 5, P1, P2, P3, and P4 of CRC bits are interleaved and positioned between information bits. Also, it is assumed that the P1, P2, P3 and P4 CRC bits are arranged in the order of P1, P2, P3 and P4 between the interleaved information. In this case, P1 is associated only with information bits located before P1 in a continuous sequence of interleaved information bits. Also, when P2 is located after information bits after P1 are interleaved, P2 is associated only with interleaved information bits from P1 to P2 or before P2 bits. Similarly, the interleaving pattern should be designed so that P3 and P4 are associated only with information before the CRC.

Even when the P1, P2, P3, and P4 CRC bits are not arranged in sequence but arranged in the reverse order, or when the P1, P2, P3, and P4 CRC bits are interleaved and located between information bits, the interleaver should be designed so that a specific CRC bit should be associated only with information bits located before the corresponding CRC bit.

Next, a multi-interleaver design method according to the disclosure will be described with reference to FIG. 4. In operation 410, a range [Kmin, Kmax] of the information bits considered by the system is divided into j sections so as to have equal intervals, that is, the same series of intervals. That is, all sections are divided into j sections so that Kmin1=Kmin, Kmaxi=floor(Kmax*i/j), and Kmini=floor(Kmax*(i−1)/j)+1.

Next, in operation 420, nDCRC bits of all possible orders are selected from nCRC CRC bits, and then a corresponding DCRC matrix (size K×nDCRC) may be configured. In this case, distributed-CRC (DCRC) means that parity bits generated by CRC encoding are not directly attached to a payload, but each bit is distributed. Accordingly, nDCRC means the number of bits distributed between payload bits among all CRC parity bits. Also, "full CRC parity bit-nDCRC" is the number of bits appended after the payload bit. For example, when the permutation is selected as P3, P1, and P2 for nDCRC=3 in the situation of FIG. 5, the corresponding DCRC is as shown in FIG. 6A. The CRC bits illustrated in FIG. 6A are still difficult to be placed in the middle of the information bits. Therefore, in the disclosure, a matrix as shown in FIG. 6B can be obtained through proper row interleaving of information bits. Here, it can be seen that P3 is located immediately after information bits 2, 3, 4, 5, 7, 9, and 10, P1 is located after information bits 2, 3, 5, 7, 1, 8, and 11, and P2 is located immediately after information bits 3, 4, 5, 10, 8, 11, and 6. Here, Px is generated by adding all the information bits of the index indicated by 1. For example, P3 is generated by adding U2, U3, U4, U5, U7, U9, and U10. In SC decoding of the polar code, since bits are sequentially decoded one by one, P3 should be placed after the bits involved in the generation of P3. If U2, U3, U4, U5, U7, U9 and U10 are interleaved and placed in front, P3 can be placed immediately after them.

That is, corresponding interleaving patterns 2, 3, 4, 5, 7, 9, 10, P3, 1, 8, 11, P1, 6, P2, 12, and P4 can be obtained for the permutations of P3, P1, and P2 columns. When the early termination gain is defined as a ratio of information bits behind each CRC bit, the early termination gains of the respective CRC bits are 5/12, 2/12, and 1/12.

Next, in operation 430, when the early termination gain is calculated, first, a sum or weight of the early termination gains of the CRC bits for one K may be used as the early termination gain. One K may be the length of information bits in the j divided interleavers. For example, on the basis of the contents described with reference to FIGS. 5, 6A, and 6B, it is assumed that an information word length 24 is divided into two sections, and two constituent interleavers corresponding to the information word lengths 12 and 24 are implemented.

Here, for a case where the length of the information bits is 12, a sum or weight of the early termination gains of the CRC bits may be used as the early termination gain for one K. For example, as shown in FIG. 6B, an early termination gain when early termination is performed at P3, an early termination gain when early termination is performed at P1, and an early termination gain when early termination is performed at P2 may exist. In this case, in the simplest method, a sum of the early termination gains may be configured as an early termination gain, or a sum of values obtained by multiplying weights by giving an early termination gain weight to at least one specific CRC bit among the early termination gains at P3, P1, and P2 may be configured as the early termination gain. In the example of FIG. 6B described above, the early termination gains of P3, P1, and P2 become 5/12, 2/12, and 1/12, respectively, and thus, if not weighted, a sum thereof becomes 8/12. In the case of FIG. 6B, the early termination gain may be determined to be 2/3. Based on this calculation, the early termination gain may be calculated for the respective sections, that is, when the length of the information bits is 24.

When a total of early termination gains for all Ks in each section are calculated, the early termination gains for each K are multiplied by K, and then a sum or weight of the obtained values can be used as the early termination gain. According to the disclosure, DCRC is applied to various information word lengths K using one or multiple interleavers. As described above, the early termination gain is calculated using one metric for various Ks. For example, if it is considered that K is 10 bits and 20 bits and the calculated values of the early termination gains are A and B, respectively, the sum of the early termination gains is calculated as 10 A+20 B.

As described with reference to FIGS. 6A and 6B, when a specific interleaver is configured, the early termination gain of each interleaver may be different. Accordingly, in operation 440, each interleaver should configure different interleavers for each section, that is, according to the length, so that the early termination gain may be maximized. Therefore, there may be a plurality of interleavers corresponding to each length. In operation 440, a permutation of CRC bits is selected in which the early termination gain is a maximum in each section. That is, in operation 440, the permutation of the CRC bits for which the early termination gain is maximized for each constituent interleaver is selected. Next, in operation 450, the boundary value of each section is adjusted to maximize the sum of early termination gains of [Kmin, Kmax]. That is, in first operation 410, the interval is divided at equal intervals, but in operation 440, the sections are divided at equal intervals, but are finally adjusted at an interval in which the sum of the early termination gains is maximized.

Next, in operation 460, an interleaver pattern for the entire information bit with the permutation of the given CRC bits corresponding to the maximum value of the early termination gain of each section is designed. Such an interleaver pattern can be designed in various ways. In general, the order of the preceding information bits for one CRC bit does not affect the early termination gain. However, the disclosure includes a method of configuring an interleaving pattern of information bits by arranging indices of corresponding information bits in ascending or descending order. The disclosure also includes an interleaving pattern of information bits generated in a case in which binary vectors are arranged in ascending order by regarding each row as a binary vector when a corresponding DCRC matrix is configured. An interleaving pattern of other information bits may affect block error rate (BLER) performance or frame error rate (FER) performance of polar codes. In operation 460, the interleaver pattern including the CRC bits is designed and then terminated.

As described above, the interleaver design results for nCRC=19(0xA2B79), nDCRC=6/7, Kmin=9, Kmax=200/300/400, and j=1/2/4/8 are obtained in the forms of Table 2 to Table 25 below. Each common number is an index of information bits and the numbers marked with P are indexes of CRC bits. The above parameters are values that can be considered in a communication system to which an actual polar code is applied, and the disclosure may use values corresponding to the corresponding interleavers as interleaving patterns.

Table 2 is a table illustrating indexes of information bits and indexes of CRC bits for the interleaving result of the interleaver in a case in which the interleaver is designed on the basis of the disclosure when nDCRC=6, Kmin=9, Kmax=200, and j=1. Since Table 2 is a case where j=1 as previously assumed, the multi-interleaver 313 may correspond to a case having only one constituent interleaver therein.

TABLE 2

199 196 192 189 188 187 185 182 178 177 176 172 170 168 167 165 163 161 160 157 156 153 152 149 142 141 140 138 137 135 132 131 130 129 127 126 124 123 122 120 118 117 112 110 109 107 101 100 97 90 88 87 85 84 82 81 80 74 69 68 65 61 58 55 54 49 48 45 44 42 41 35 34 33 31 25 23 22 20 16 14 13 11 9 7 6 5 3 1 P7 200 197 191 175 169 162 159 148 143 139 134 128 125 121 116 111 108 105 104 102 98 96 93 92 83 79 77 75 73 71 64 63 60 57 56 52 51 47 46 40 39 38 36 29 28 27 19 12 10 P11 195 186 180 173 164 158 155 146 145 136 114 91 86 78 72 70 67 62 43 32 30 26 17 8 4 P18 193 181 174 171 144 133 113 94 89 59 53 37 24 18 15 P3 198 183 179 151 99 95 76 66 P10 190 166 115 103 P2 194 184 154 150 147 119 106 50 21 2 P1 P4 P5 P6 P8 P9 P12 P13 P14 P15 P16 P17 P19

Table 3 is a table illustrating indexes of information bits and indexes of CRC bits corresponding to the interleaving result of the interleaver in a case in which the interleaver is designed on the basis of the disclosure when nDCRC=6, Kmin=9, Kmax=200, and j=2. Since Table 3 is a case where j=2 as previously assumed, the multi-interleaver 313 may correspond to a case having two constituent interleavers therein.

TABLE 3

| | |
|---|---|
| [9, 100] | 100 97 96 91 89 88 87 82 75 70 69 68 67 62 61 59 56 53 52 49 48 43 42 40 39 38 35 34 28 27 28 25 24 23 21 20 18 16 12 11 10 8 7 5 4 2 1 P11 99 92 85 78 77 76 72 65 63 60 57 41 37 32 31 30 29 22 17 9 P7 95 86 80 73 64 58 55 46 45 36 14 P18 98 83 79 51 44 13 P10 90 81 71 66 33 15 3 P2 74 47 19 6 P19 94 93 84 54 50 P1 P3 P4 P5 P8 P8 P9 P12 P13 P14 P15 P16 P17 |
| [101, 200] | 199 196 192 189 188 187 185 182 178 177 176 172 170 168 167 165 163 161 160 157 156 153 152 149 142 141 140 138 137 135 132 131 130 129 127 126 124 123 122 120 118 117 112 110 109 107 101 100 97 90 88 87 85 84 82 81 80 74 69 68 65 61 56 55 54 49 48 45 44 42 41 35 34 33 31 25 23 22 20 16 14 13 11 9 7 6 5 3 1 P7 200 197 191 175 169 162 159 148 143 139 134 128 125 121 116 111 108 105 104 102 98 96 93 92 83 79 77 75 73 71 64 63 60 57 56 52 51 47 46 40 39 38 36 29 28 27 19 12 10 P11 195 186 180 173 164 158 155 146 145 136 114 91 86 78 72 70 67 62 43 32 30 26 17 8 4 P18 193 181 174 171 144 133 113 94 89 59 53 37 24 18 15 P3 196 183 179 151 99 95 76 66 P10 190 166 115 103 P2 194 184 154 150 147 119 106 50 21 2 P1 P4 P5 P6 P8 P9 P12 P13 P14 P15 P16 P17 P19 |

Table 4 is a table illustrating indexes of information bits and indexes of CRC bits corresponding to the interleaving result of the interleaver in a case in which the interleaver is designed on the basis of the disclosure when nDCRC=6, Kmin=9, Kmax=200, and j=4. Since Table 4 is a case where j=4 as previously assumed, the multi-interleaver 313 may correspond to a case having four constituent interleavers therein.

TABLE 4

| | |
|---|---|
| [9, 50] | 49 48 47 44 38 32 28 27 25 22 16 14 13 12 10 9 8 7 5 4 1 P9 45 40 39 33 26 24 23 20 17 11 P5 50 29 15 6 2 P10 43 36 21 19 18 3 P8 37 31 P4 46 P19 42 41 35 34 30 P1 P2 P3 P6 P7 P11 P12 P13 P14 P15 P16 P17 P18 |
| [51, 100] | 100 97 96 91 89 88 87 82 75 70 69 68 67 62 61 59 56 53 52 49 48 43 42 40 39 38 35 34 28 27 26 25 24 23 21 20 18 16 12 11 10 8 7 5 4 2 1 P11 99 92 85 78 77 76 72 65 63 60 57 41 37 32 31 30 29 22 17 9 P7 95 86 80 73 64 58 55 46 45 36 14 P18 98 83 79 51 44 13 P10 93 81 74 71 33 P3 90 65 15 3 P2 94 84 54 50 47 19 6 P1 P4 P5 P6 P8 P9 P12 P13 P14 P15 P16 P17 P19 |
| [101, 150] | 149 146 142 139 138 137 135 132 128 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 133 129 101 49 45 26 16 P10 140 116 65 53 P2 144 134 104 100 97 69 56 P1 P4 P5 P6 P8 P9 P12 P13 P14 P15 P16 P17 P19 |
| [151, 200] | 200 198 197 196 195 193 190 189 188 185 184 181 180 179 175 174 171 170 169 168 164 162 161 160 159 153 149 147 141 134 133 131 129 128 127 126 122 116 115 113 112 109 108 107 102 101 100 98 97 93 92 91 90 89 88 87 84 78 76 74 73 72 70 66 64 61 60 47 44 39 38 36 34 33 32 25 21 18 15 13 11 10 9 8 7 6 P16 187 186 183 178 176 173 166 165 163 156 146 144 143 140 137 130 119 110 106 105 103 94 85 82 79 75 71 68 65 63 62 59 56 53 50 41 31 30 29 28 27 26 24 23 20 17 14 5 4 2 1 P19 199 194 192 167 158 152 148 132 125 121 114 111 99 96 86 83 77 69 46 43 37 35 12 P15 191 177 155 151 139 136 123 117 81 80 67 57 54 48 40 22 19 P6 145 142 135 124 95 58 55 52 16 3 P2 182 172 150 45 P4 157 154 138 120 118 104 51 49 42 P1 P3 P5 P7 P8 P9 P10 P11 P12 P13 P14 P17 P18 |

Table 5 is a table illustrating indexes of information bits and indexes of CRC bits corresponding to the interleaving result of the interleaver in a case in which the interleaver is designed on the basis of the disclosure when nDCRC=6, Kmin=9, Kmax=200, and j=8. Since Table 5 is a case where j=8 as previously assumed, the multi-interleaver 313 may correspond to a case having eight constituent interleavers therein.

TABLE 5

| | |
|---|---|
| [9, 25] | 24 23 22 19 13 7 3 2 P9 20 15 14 8 1 P5 25 4 P10 18 11 P8 12 6 P4 10 5 P18 21 17 16 9 P1 P2 P3 P6 P7 P11 P12 P13 P14 P15 P16 P17 P19 |
| [26, 50] | 49 48 47 44 38 32 28 27 25 22 16 14 13 12 10 9 8 7 5 4 1 P9 45 40 39 33 26 24 23 20 17 11 P5 50 29 15 6 2 P10 43 36 21 19 18 3 P8 37 31 P4 46 P19 42 41 35 34 30 P1 P2 P3 P6 P7 P11 P12 P13 P14 P15 P16 P17 P18 |
| [51, 75] | 75 72 71 66 64 63 62 57 50 45 44 43 42 37 36 34 31 28 27 24 23 18 17 15 14 13 10 9 3 2 1 P11 74 67 60 53 52 51 47 40 38 35 32 16 12 7 6 5 4 P7 70 61 55 48 39 33 30 21 20 11 P18 68 56 49 46 19 8 P3 69 65 26 P14 73 58 41 P2 59 54 29 25 22 P1 P4 P5 P6 P8 P9 P10 P12 P13 P15 P16 P17 P19 |

TABLE 5-continued

| | |
|---|---|
| [76, 100] | 100 97 96 91 89 88 87 82 75 70 69 68 67 62 61 59 56 53 52 49 48 43 42 40 39 38 35 34 28 27 26 25 24 23 21 20 18 16 12 11 10 8 7 5 4 2 1 P11 99 92 85 78 77 76 72 65 63 60 57 41 37 32 31 30 29 22 17 9 P7 95 86 80 73 64 58 55 46 45 36 14 P18 98 83 79 51 44 13 P10 93 81 74 71 33 P3 90 66 15 3 P2 94 84 54 50 47 19 6 P1 P4 P5 P6 P8 P9 P12 P13 P14 P15 P16 P17 P19 |
| [101, 125] | 124 121 117 114 113 112 110 107 103 102 101 97 95 93 92 90 88 86 85 82 81 78 77 74 67 66 65 63 62 60 57 56 55 54 52 51 49 48 47 45 43 42 37 35 34 32 26 25 22 15 13 12 10 9 7 6 5 P7 125 122 116 100 94 87 84 73 68 64 59 53 50 46 41 36 33 30 29 27 23 21 18 17 8 4 2 P11 120 111 105 98 89 83 80 71 70 61 39 16 11 3 P18 118 106 99 96 69 58 38 19 14 P3 123 108 104 76 24 20 1 P10 115 91 40 28 P2 119 109 79 75 72 44 31 P1 P4 P5 P6 P8 P9 P12 P13 P14 P15 P16 P17 P19 |
| [126, 150] | 149 146 142 139 138 137 135 132 128 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 68 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 140 134 129 97 65 26 16 P16 116 100 56 45 P1 144 133 104 101 69 53 49 P2 P4 P5 P6 P8 P9 P10 P12 P13 P14 P15 P17 P19 |
| [151, 175] | 173 171 169 163 162 161 160 159 156 154 152 151 149 147 146 142 141 139 138 137 136 132 129 122 120 119 117 116113 110 106 104 103 102 95 92 88 86 83 82 81 79 78 76 74 70 67 66 65 61 60 58 55 52 51 48 47 46 44 41 39 38 37 3635 32 29 26 23 17 14 12 7 6 5 4 3 2 1 P17 174 172 166 165 164 157 155 150 145 144 140 135 125 123 109 107 105 98 91 89 85 84 77 73 69 68 64 63 54 50 49 42 40 20 15 10 9 8 P1 175 170 168 143 134 128 124 108 101 97 90 87 75 72 62 59 53 45 22 19 13 11 P16 167 153 131 127 115 112 99 93 57 56 43 33 30 24 16 P7 121 118 111 100 71 34 31 28 P3 158 148 126 21 P5 133 130 114 96 94 80 27 25 18 P2 P4 P6 P8 P9 P10 P11 P12 P13 P14 P15 P18 P19 |
| [176, 200] | 200 198 197 196 195 193 190 189 188 185 184 181 180 179 175 174 171 170 169 168 164 162 161 160 159 153 149 147 141 134 133 131 129 128 127 126 122 116 115 113 112 109 108 107 102 101 100 98 97 93 92 91 90 89 88 87 84 78 76 74 73 72 70 66 64 61 60 47 44 39 38 36 34 33 32 25 21 18 15 13 11 10 9 8 7 6 P16 187 186 183 178 176 173 166 165 163 156 146 144 143 140 137 130 119 110 106 105 103 94 85 82 79 75 71 68 65 63 62 59 56 53 50 41 31 30 29 28 27 26 24 23 20 17 14 5 4 2 1 P19 199 194 192 167 158 152 148 132 125 121 114 111 99 96 86 83 77 69 46 43 37 35 12 P15 172 157 145 138 136 123 120 118 81 80 57 54 51 45 40 19 16 3 P3 191 182 177 150 104 95 67 42 P1 155 151 139 117 48 22 P6 154 142 135 124 58 55 52 49 P2 P4 P5 P7 P8 P9 P10 P11 P12 P13 P14 P17 P18 |

Table 6 is a table illustrating indexes of information bits and indexes of CRC bits corresponding to the interleaving result of the interleaver in a case in which the interleaver is designed on the basis of the disclosure when nDCRC=6, Kmin=9, Kmax=300, and j=1. Since Table 6 is a case where j=1 as previously assumed, the multi-interleaver 313 may correspond to a case having one component interleaver therein.

TABLE 6

299 296 292 289 288 287 285 282 278 277 276 272 270 288 267 265 263 261 260 257 256 253 252 249 242 241 240 238 237 235 232 231 230 229 227 226 224 223 222 220 218 217 212 210 209 207 201 200 197 190 188 187 185 184 182 181 180 174 169 168 165 161 158 155 154 149 148 145 144 142 141 135 134 133 131 125 123 122 120 116 114 113 111 109 107 106 105 103 101 100 95 94 92 90 88 87 83 82 80 79 76 73 72 71 68 65 60 59 58 57 56 54 53 49 47 44 43 42 41 40 33 31 30 29 26 25 23 22 20 18 17 15 12 11 10 9 6 3 2 1 P7 300 297 291 275 269 262 259 248 243 239 234 228 225 221 216 211 208 205 204 202 198 196 193 192 183 179 177 175 173 171 164 163 160 157 156 152 151 147 146 140 139 138 136 129 128 127 119 112 110 99 97 96 91 89 86 85 81 74 70 69 67 64 63 62 61 52 48 45 37 36 35 32 28 24 19 13 4 P11 295 286 280 273 264 258 255 246 245 236 214 191 186 178 172 170 167 162 143 132 130 126 117 108 104 98 93 78 75 66 51 46 39 24 14 P18 298 283 279 251 244 213 199 195 194 189 176 166 137 115 77 55 27 16 P10 290 281 271 266 233 215 203 50 5 P2 293 274 159 153 124 118 84 7 P3 294 284 254 250 247 219 206 150 121 102 38 8 P1 P4 P5 P6 P8 P9 P12 P13 P14 P15 P16 P17 P19

Table 7 is a table illustrating indexes of information bits and indexes of CRC bits corresponding to the interleaving result of the interleaver in a case in which the interleaver is designed on the basis of the disclosure when nDCRC=6, Kmin=9, Kmax=300, and j=2. Since Table 7 is a case where j=2 as previously assumed, the multi-interleaver 313 may correspond to a case having two component interleavers therein.

TABLE 7

| | |
|---|---|
| [9, 150] | 149 146 142 139 138 137 135 132 128 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 133 129 101 49 45 26 16 P10 140 116 65 53 P2 144 134 104 100 97 69 56 P1 P4 P5 P6 P8 P9 P12 P13 P14 P15 P16 P17 P19 |

TABLE 7-continued

| | |
|---|---|
| [151, 300] | 300 298 297 296 295 293 290 289 288 285 284 281 280 279 275 274 271 270 269 268 264 262 261 260 259 253 249 247 241 234 233 231 229 228 227 226 222 216 215 213 212 209 208 207 202 201 200 198 197 193 192 191 190 189 188 187 184 178 176 174 173 172 170 166 164 161 160 147 144 139 138 136 134 133 132 125 121 118 115 113 111 110 109 108 107 106 98 97 96 92 90 87 86 85 84 80 79 78 75 74 70 69 67 62 61 60 59 58 57 55 54 53 52 51 50 48 47 43 40 39 38 35 34 32 31 28 26 25 23 19 18 16 14 13 12 8 4 3 P16 287 286 283 278 276 273 266 265 263 256 246 244 243 240 237 230 219 210 206 205 203 194 185 182 179 175 171 168 165 163 162 159 156 153 150 141 131 130 129 128 127 126 124 123 120 117 114 105 104 102 101 99 94 91 89 88 81 77 76 73 72 64 49 46 45 44 42 41 37 22 15 11 1 P19 299 294 292 267 258 252 248 232 225 221 214 211 199 196 186 183 177 169 146 143 137 135 112 95 83 68 66 56 33 30 27 24 17 7 2 P15 277 257 254 250 242 239 238 236 224 223 218 181 155 149 145 142 93 21 10 P8 272 245 220 180 157 154 151 140 119 116 103 36 29 6 5 P3 282 195 158 152 148 82 71 P4 291 255 251 235 217 204 167 122 100 65 63 20 9 P1 P2 P5 P6 P7 P9 P10 P11 P12 P13 P14 P17 P18 |

Table 8 is a table illustrating indexes of information bits and indexes of CRC bits corresponding to the interleaving result of the interleaver in a case in which the interleaver is designed on the basis of the disclosure when nDCRC=6, Kmin=9, Kmax=300, and j=4. Since Table 8 is a case where j=4 as previously assumed, the multi-interleaver 313 may correspond to a case having four constituent interleavers therein.

TABLE 8

| | |
|---|---|
| [9, 75] | 75 72 71 66 64 63 62 57 50 45 44 43 42 37 36 34 31 28 27 24 23 18 17 15 14 13 10 9 3 2 1 P11 74 67 60 53 52 51 47 40 38 35 32 16 12 7 6 5 4 P7 70 61 55 48 39 33 30 21 20 11 P18 73 58 54 26 19 P10 69 41 29 25 22 8 P9 65 49 P5 68 59 56 46 P1 P2 P3 P4 P6 P8 P12 P13 P14 P15 P16 P17 P19 |
| [76, 150] | 149 146 142 139 138 137 135 132 128 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 133 129 101 49 45 26 16 P10 140 116 65 53 P2 144 134 104 100 97 69 56 P1 P4 P5 P6 P8 P9 P12 P13 P14 P15 P16 P17 P19 |
| [151, 225] | 225 223 222 221 220 218 215 214 213 210 209 206 205 204 200 199 196 195 194 193 189 187 186 185 184 178 174 172 166 159 158 156 154 153 152 151 147 141 140 138 137 134 133 132 127 126 125 123 122 118 117 116 115 114 113 112 109 103 101 99 98 97 95 91 89 86 85 72 69 64 63 61 59 58 57 50 46 43 40 38 36 35 34 33 32 31 23 22 21 17 15 12 11 10 9 5 4 3 P16 212 211 208 203 201 198 191 190 188 181 171 169 168 165 162 155 144 135 131 130 128 119 110 107 104 100 96 93 90 88 87 84 81 78 75 66 56 55 54 53 52 51 49 48 45 42 39 30 29 27 26 24 19 16 14 13 6 2 1 P19 224 219 217 192 183 177 173 157 150 146 139 136 124 121 111 108 102 94 71 68 62 60 37 20 8 P15 197 182 170 163 161 148 145 143 106 105 82 79 76 70 65 44 41 28 P3 216 207 202 175 129 120 92 67 25 18 7 P1 180 176 164 142 73 47 P6 179 167 160 149 83 80 77 74 P2 P4 P5 P7 P8 P9 P10 P11 P12 P13 P14 P17 P18 |
| [226, 300] | 300 298 297 296 295 293 290 289 288 285 284 281 280 279 275 274 271 270 269 268 264 262 261 260 259 253 249 247 241 234 233 231 229 228 227 226 222 216 215 213 212 209 208 207 202 201 200 198 197 193 192 191 190 189 188 187 184 178 176 174 173 172 170 166 164 161 160 147 144 139 138 136 134 133 132 125 121 118 115 113 111 110 109 108 107 106 98 97 96 92 90 87 86 85 84 80 79 78 75 74 70 69 67 62 61 60 59 58 57 55 54 53 52 51 50 48 47 43 40 39 38 35 34 32 31 28 26 25 23 19 18 16 14 13 12 8 4 3 P16 294 287 286 277 276 272 267 266 263 257 254 245 244 242 238 235 220 217 211 206 204 203 199 195 186 185 183 180 177 171 169 163 162 157 154 151 148 142 137 131 130 129 128 127 126 124 122 116 112 105 103 102 100 99 95 89 88 82 77 73 71 65 56 46 45 44 42 33 29 24 20 9 2 1 P17 299 291 282 265 250 248 232 230 223 214 210 194 179 175 167 165 145 140 135 119 114 93 91 81 76 68 63 49 41 36 27 17 15 5 P1 278 258 255 251 243 240 239 237 225 224 219 182 156 150 146 143 94 22 11 P9 273 246 221 181 158 155 152 141 120 117 104 37 30 7 6 P4 283 196 159 153 149 83 72 P5 292 256 252 236 218 205 168 123 101 66 64 21 10 P2 P3 P6 P7 P8 P10 P11 P12 P13 P14 P15 P18 P19 |

Table 9 is a table illustrating indexes of information bits and indexes of CRC bits corresponding to the interleaving result of the interleaver in a case in which the interleaver is designed on the basis of the disclosure when nDCRC=6, Kmin=9, Kmax=300, and j=8. Since Table 9 is a case where j=2 as previously assumed, the multi-interleaver 313 may correspond to a case having two constituent interleavers therein.

TABLE 9

| | |
|---|---|
| [9, 37] | 36 35 34 31 25 19 15 14 12 9 3 1 P9 32 27 26 20 13 11 10 7 4 P5 37 16 2 P10 30 23 8 6 5 P8 24 18 P4 33 P19 29 28 22 21 17 P1 P2 P3 P6 P7 P11 P12 P13 P14 P15 P16 P17 P18 |

TABLE 9-continued

| | |
|---|---|
| [38, 75] | 75 72 71 66 64 63 62 57 50 45 44 43 42 37 36 34 31 28 27 24 23 18 17 15 14 13 10 9 3 2 1 P11 74 67 60 53 52 51 47 40 38 35 32 16 12 7 6 5 4 P7 70 61 55 48 39 33 30 21 20 11 P18 68 56 49 46 19 8 P3 69 65 26 P14 73 58 41 P2 59 54 29 25 22 P1 P4 P5 P6 P8 P9 P10 P12 P13 P15 P16 P17 P19 |
| [76, 112] | 111 109 107 101 100 99 98 97 94 92 90 89 87 85 84 80 79 77 76 75 74 70 67 60 58 57 55 54 51 48 44 42 41 40 33 30 26 24 21 20 19 17 16 14 12 8 5 4 3 P18 112 108 103 82 81 73 71 68 65 64 61 52 50 47 48 39 38 37 36 35 32 28 23 22 13 10 9 2 P11 104 88 72 69 53 49 43 34 29 P7 110 95 91 63 56 25 11 7 6 1 P10 105 93 86 83 45 P3 102 78 27 15 P2 106 96 66 62 59 31 18 P1 P4 P5 P6 P8 P9 P12 P13 P14 P15 P16 P17 819 |
| [113, 150] | 149 146 142 139 138 137 135 132 128 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 140 134 129 97 65 26 16 P16 116 100 58 45 P1 144 133 104 101 69 53 49 P2 P4 P5 P6 P8 P9 P10 P12 P13 P14 P15 P17 P19 |
| [151, 187] | 187 185 184 183 182 180 177 176 175 172 171 168 167 166 162 161 158 157 156 155 151 149 148 147 146 140 136 134 128 121 120 118 116 115 114 113 109 103 102 100 99 96 95 94 89 88 87 85 84 80 79 78 77 76 75 74 71 65 63 61 60 59 57 53 51 48 47 34 31 26 25 23 21 20 19 12 8 5 2 P16 174 173 170 165 163 160 153 152 150 143 133 131 130 127 124 117 106 97 93 92 90 81 72 69 66 62 58 55 52 50 49 46 43 40 37 28 18 17 16 15 14 13 11 10 7 4 1 P19 186 181 179 154 145 139 135 119 112 108 101 98 86 83 73 70 64 56 33 30 24 22 P15 159 144 132 125 123 110 107 105 68 67 44 41 38 32 27 6 3 P3 178 169 164 137 91 82 54 29 P1 142 138 126 104 35 9 P6 141 129 122 111 45 42 39 36 P2 P4 P5 P7 P8 P9 P10 P11 P12 P13 P14 P17 P18 |
| [188, 225] | 225 223 222 221 220 218 215 214 213 210 209 206 205 204 200 199 196 195 194 193 189 187 186 185 184 178 174 172 166 159 158 156 154 153 152 151 147 141 140 138 137 134 133 132 127 126 125 123 122 118 117 116 115 114 113 112 109 103 101 99 98 97 95 91 89 86 85 72 69 64 63 61 59 58 57 50 46 43 40 38 36 35 34 33 32 31 23 22 21 17 15 12 11 10 9 5 4 3 P16 212 211 208 203 201 198 191 190 188 181 171 169 168 165 162 155 144 135 131 130 128 119 110 107 104 100 96 93 90 88 87 84 81 78 75 66 56 55 54 53 52 51 49 48 45 42 39 30 29 27 26 24 19 16 14 13 6 2 1 P19 224 219 217 192 182 177 173 157 150 146 139 136 124 121 111 108 102 94 71 68 62 60 37 20 8 P15 202 182 179 175 167 164 163 161 149 148 143 106 80 74 70 67 18 P8 197 170 145 105 82 79 76 65 44 41 28 P3 207 120 83 77 73 7 P4 216 180 176 160 142 129 92 47 25 P1 P2 P5 P6 P7 P9 P10 P11 P12 P13 P14 P17 P18 |
| [226, 262] | 262 260 259 258 257 255 252 251 250 247 246 243 242 241 237 236 233 232 231 230 226 224 223 222 221 215 211 209 203 196 195 193 191 190 189 188 184 178 177 175 174 171 170 169 164 163 162 160 159 155 154 153 152 151 150 149 146 140 138 136 135 134 132 128 126 123 122 109 106 101 100 98 96 95 94 87 83 80 77 75 73 72 71 70 69 68 60 59 58 54 52 49 48 47 46 42 41 40 37 36 32 31 29 24 23 22 21 20 19 17 16 15 14 13 12 10 9 5 2 1 P16 256 249 248 239 238 234 229 228 225 219 216 207 206 204 200 197 182 179 173 168 166 165 161 157 148 147 145 142 139 133 131 125 124 119 116 113 110 104 99 93 92 91 90 89 88 86 84 78 74 67 65 64 62 61 57 51 50 44 39 35 33 27 18 8 7 6 4 P17 261 253 244 227 212 210 194 192 185 178 172 156 141 137 129 127 107 102 97 81 76 55 53 43 38 20 25 11 3 P1 240 220 217 213 205 202 201 199 187 186 181 144 118 112 108 105 56 P9 235 208 183 143 120 117 114 103 82 79 66 P4 245 158 121 115 111 45 34 P5 254 218 214 198 180 167 130 85 63 28 26 P2 P3 P6 P7 P8 P10 P11 P12 P13 P14 P15 P18 P19 |
| [263, 300] | 300 298 297 296 295 293 290 289 288 285 284 281 280 279 275 274 271 270 269 268 264 262 261 260 259 253 249 247 241 234 233 231 229 228 227 226 222 216 215 213 212 209 208 207 202 201 200 198 197 193 192 191 190 189 188 187 184 178 176 174 173 172 170 164 161 160 147 144 [139 138 136 134 133 132 125 121 118 115 113 111 110 109 108 107 106 98 97 96 92 90 87 86 85 84 80 79 78 75 74 70 69 67 62 61 60 59 58 57 55 54 53 52 51 50 48 47 43 40 39 38 35 34 32 31 28 26 25 23 19 18 16 14 13 12 8 4 3 P16 294 287 286 277 276 272 267 266 263 257 254 245 244 242 238 235 220 217 211 206 204 202 199 195 186 185 183 180 177 171 169 163 162 157 154 151 148 142 137 131 130 129 128 127 126 124 122 116 112 105 103 102 100 99 95 89 88 82 77 73 71 65 56 46 45 44 42 33 29 24 20 9 2 1 P17 299 291 282 265 250 248 232 230 223 214 210 194 179 175 167 165 145 140 135 119 114 93 91 81 76 68 63 49 41 36 27 17 15 5 P1 278 258 255 251 243 240 239 237 225 224 219 182 156 150 146 143 94 22 11 P9 273 246 221 181 158 155 152 141 120 117 104 |

Table 10 is a table illustrating indexes of information bits and indexes of CRC bits corresponding to the interleaving result of the interleaver in a case in which the interleaver is designed on the basis of the disclosure when nDCRC=6, Kmin=9, Kmax=400, and j=1. Since Table 10 is a case where j=1 as previously assumed, the multi-interleaver 313 may correspond to a case having one component interleaver therein.

TABLE 10

400 398 397 396 395 393 390 389 388 385 384 381 380 379 375 374 371 370 369 368 364 362 361 360 359 353
349 347 341 334 333 331 329 328 327 326 322 316 315 313 312 309 308 307 302 301 300 298 297 295 292 291
290 289 288 287 284 278 276 274 273 272 270 266 264 261 260 247 244 239 238 236 234 233 232 225 221 218
215 213 211 210 209 208 207 206 198 197 196 192 190 187 186 185 184 180 179 178 175 174 170 169 167 162
161 160 159 158 157 155 154 153 152 151 150 148 147 143 140 139 138 135 134 132 131 128 126 125 123 119
118 116 114 113 112 108 104 103 100 97 92 89 86 84 82 78 77 75 74 73 71 69 67 66 64 63 62 61 59 58 57 55 54
52 51 50 49 48 46 44 43 41 40 39 38 34 32 31 27 26 25 24 23 19 18 15 14 13 12 9 5 P16 367 386 383 378 376 373
366 365 363 356 346 344 343 340 337 330 319 310 306 305 303 294 285 282 279 275 271 268 265 263 262 259
256 253 250 241 231 230 229 228 227 226 224 223 220 217 214 205 204 202 201 199 194 191 189 188 181 177
176 173 172 164 149 146 145 144 142 141 137 122 115 111 101 98 95 94 91 88 85 81 72 70 68 65 56 53 37 36 35

TABLE 10-continued 33 30 28 21 16 11 8 6 3 P19 399 394 392 367 358 352 343 332 325 321 314 311 299 296 286 283 277 269 246 243 237 235 212 195 183 168 166 156 183 130 127 124 117 107 102 99 96 83 76 60 47 45 42 22 17 4 P15 377 357 354 350 342 339 338 336 324 323 318 261 255 249 245 242 193 121 110 80 79 29 20 10 7 P8 372 345 320 280 257 254 251 240 219 216 203 136 129 106 105 90 87 2 1 P3 382 295 258 252 248 162 171 P4 391 355 351 335 317 304 267 222 200 165 163 120 109 93 P1 P2 P5 P6 P7 P9 P10 P11 P12 P13 P14 P17 P18

Table 11 is a table illustrating indexes of information bits and indexes of CRC bits corresponding to the interleaving result of the interleaver in a case in which the interleaver is designed on the basis of the disclosure when nDCRC=6, Kmin=9, Kmax=400, and j=2. Since Table 11 is a case where j=2 as previously assumed, the multi-interleaver 313 may correspond to a case having two component interleavers therein.

TABLE 11

| | |
|---|---|
| [9, 200] | 199 196 192 189 188 187 185 182 178 177 176 172 170 168 167 165 163 161 160 157 156 153 152 149 142 141 140 138 137 135 132 131 130 129 127 126 124 123 122 120 118 117 112 110 109 107 101 100 97 90 88 87 85 84 82 81 80 74 69 68 65 61 58 55 54 49 48 45 44 42 41 35 34 33 31 25 23 22 20 16 14 13 11 9 7 6 5 3 1 P7 200 197 191 175 169 162 159 148 143 139 134 128 125 121 116 111 108 105 104 102 98 96 93 92 83 79 77 75 73 71 64 63 60 57 56 52 51 47 46 40 39 38 36 29 28 27 19 12 10 P11 195 186 180 173 164 158 155 146 145 136 114 91 86 78 72 70 67 62 43 32 30 26 17 8 4 P18 193 181 174 171 144 133 113 94 89 59 53 37 24 18 15 P3 198 183 179 151 99 95 76 66 P10 190 166 115 103 P2 194 184 154 150 147 119 106 50 21 2 P1 P4 P5 P6 P8 P9 P12 P13 P14 P15 P16 P17 P19 |
| [201, 400] | 400 398 397 396 395 393 390 389 388 385 384 381 380 379 375 374 371 370 369 368 364 362 361 360 359 353 349 347 341 334 333 331 329 328 327 326 322 316 315 313 312 309 308 307 302 301 300 298 297 293 292 291 290 289 288 287 284 278 276 274 273 272 270 266 264 261 260 247 244 239 238 236 234 233 232 225 221 218 215 213 211 210 209 208 207 206 198 197 196 192 190 187 186 185 184 180 179 178 175 174 170 169 167 162 161 160 159 158 157 155 154 153 152 151 150 148 147 143 140 139 138 135 134 132 131 128 126 125 123 119 118 116 114 113 112 108 104 103 100 97 92 89 86 84 82 78 77 75 74 73 71 69 67 66 64 63 62 61 59 58 57 55 54 52 51 50 49 48 46 44 43 41 40 39 38 34 32 31 27 26 25 24 23 19 18 15 14 13 12 9 5 P16 394 387 386 377 376 372 367 366 363 357 354 345 344 342 338 335 320 317 311 306 304 303 299 295 286 285 283 280 277 271 269 263 262 267 254 251 240 242 237 231 230 229 228 227 226 224 222 216 212 205 203 202 200 199 195 189 188 182 177 173 171 165 156 146 145 144 142 133 129 124 120 109 102 101 99 96 95 93 87 83 79 70 68 56 42 37 36 35 33 29 28 22 17 7 6 4 1 P17 399 391 382 365 350 348 332 330 323 314 310 294 279 275 267 265 245 740 235 219 214 193 191 181 176 168 163 149 141 136 127 117 115 105 98 90 85 76 72 65 60 53 47 45 20 16 10 P1 378 358 355 351 343 340 339 337 325 324 319 282 256 250 246 243 194 122 111 81 80 30 21 11 8 P9 373 346 321 281 258 255 252 241 220 217 204 137 130 107 106 91 88 3 2 P4 383 296 259 253 249 183 172 P5 392 351 352 336 318 305 268 223 201 166 164 121 110 94 P2 P3 P6 P7 P8 P10 P11 P12 P13 P14 P15 P18 P19 |

Table 12 is a table illustrating indexes of information bits and indexes of CRC bits corresponding to the interleaving result of the interleaver in a case in which the interleaver is designed on the basis of the disclosure when nDCRC=6, Kmin=9, Kmax=400, and j=4. Since Table 12 is a case where j=4 as previously assumed, the multi-interleaver 313 may correspond to a case having four component interleavers therein.

TABLE 12

| | |
|---|---|
| [9, 100] | 100 97 95 91 89 88 87 82 75 70 69 68 67 62 61 59 56 53 52 49 48 43 42 40 39 38 35 34 28 27 26 25 24 23 21 20 18 16 12 11 10 8 7 5 4 2 1 P11 99 92 85 78 77 76 72 65 63 60 57 41 37 32 31 30 29 22 17 9 P7 95 86 80 73 64 58 55 46 45 36 14 P18 98 83 79 51 44 13 P10 90 81 71 66 33 15 3 P2 74 47 19 6 P19 94 93 84 54 50 P1 P3 P4 P5 P6 P8 P9 P12 P13 P14 P15 P16 P17 |
| [101, 200] | 199 196 192 189 188 187 185 182 178 177 176 172 170 168 167 165 163 161 160 157 156 153 152 149 142 141 140 138 137 135 132 131 130 129 127 125 124 123 122 120 118 117 112 110 109 107 101 100 97 90 88 87 85 84 82 81 80 74 69 68 65 61 58 55 54 49 48 45 44 42 41 35 34 33 31 25 23 22 20 16 14 13 11 9 7 6 5 3 1 P7 200 197 191 175 169 162 159 148 143 139 134 128 125 121 116 111 108 105 104 102 98 96 93 92 83 79 77 75 73 71 64 63 60 57 56 52 51 47 46 40 39 38 36 29 28 27 19 12 10 P11 195 186 180 173 164 158 155 146 145 136 114 91 86 78 72 70 67 62 43 32 30 26 17 8 4 P18 193 181 174 171 144 133 113 94 89 59 53 37 24 18 15 P3 198 183 179 151 99 95 76 66 P10 190 166 115 103 P2 194 184 154 150 147 119 106 50 21 2 P1 P4 P5 P6 P8 P9 P12 P13 P14 P15 P16 P17 P19 |
| [201, 300] | 300 298 297 296 295 293 290 289 288 285 284 281 280 279 275 274 271 270 269 268 264 262 261 260 259 253 249 247 241 234 233 231 229 228 227 226 222 216 215 213 212 209 208 207 202 201 200 198 197 193 192 191 190 189 188 187 184 178 176 174 173 172 170 166 164 161 160 147 144 139 138 136 134 133 132 125 121 118 115 113 111 110 109 108 107 106 98 97 96 92 90 87 86 85 84 80 79 78 75 74 70 69 67 62 61 60 59 58 57 55 54 53 52 51 50 48 47 43 40 39 38 35 34 32 31 28 |

TABLE 12-continued

|  |  |
|---|---|
|  | 26 25 23 19 18 16 14 13 12 8 4 3 P16 294 287 286 277 276 272 267 266 263 257 254 245 244 242 238 235 220 217 211 206 204 203 199 195 186 185 183 180 177 171 169 163 162 157 154 151 148 142 137 131 130 129 128 127 126 124 122 116 112 105 103 102 100 99 95 89 88 82 77 73 71 65 56 46 45 44 42 33 29 24 20 9 2 1 P17 299 291 282 265 250 248 232 230 223 214 210 194 179 175 167 165 145 140 135 119 114 93 91 81 76 68 63 49 41 36 27 17 15 5 P1 278 258 255 251 243 240 239 237 225 224 219 182 156 150 146 143 94 22 11 P9 273 246 221 181 158 155 152 141 120 117 104 37 30 7 6 P4 283 196 159 153 149 83 72 P5 292 256 252 236 218 205 168 123 101 66 64 21 10 P2 P3 P6 P7 P8 P10 P11 P12 P13 P14 P15 P18 P19 |
| [301,400] | 400 397 393 390 389 388 386 383 379 378 377 373 371 369 368 366 364 362 361 358 357 354 353 350 343 342 341 339 338 336 333 332 331 330 328 327 325 324 323 321 319 318 313 311 310 308 302 301 298 291 289 288 286 285 283 282 281 275 270 269 266 262 259 256 255 250 249 246 245 243 242 236 235 234 232 226 224 223 221 217 215 214 212 210 208 207 206 204 202 201 196 195 193 191 189 188 184 183 181 180 177 174 173 172 169 166 161 160 159 158 157 155 154 150 148 145 144 143 142 141 134 132 131 130 127 126 124 123 121 119 118 116 113 112 111 110 107 104 103 102 101 97 95 94 92 89 86 85 83 80 79 75 74 72 71 68 63 62 59 57 55 53 50 47 46 41 40 39 35 33 32 29 28 26 25 24 20 19 18 17 15 13 12 10 9 7 6 5 P8 398 396 395 385 384 381 380 375 374 370 360 359 349 347 334 329 326 322 316 315 312 309 307 300 297 293 292 290 287 284 278 276 274 273 272 264 261 260 247 244 239 238 233 225 218 213 211 209 198 197 192 190 187 186 185 179 178 175 170 167 162 153 152 151 147 140 139 138 135 128 125 114 108 100 84 82 78 77 73 69 67 66 64 61 58 54 52 51 49 48 44 43 38 34 31 27 23 14 P16 399 394 392 376 367 365 356 352 348 344 337 314 305 303 299 296 294 279 277 268 253 241 237 230 229 228 227 199 194 176 168 164 156 133 117 99 98 96 76 60 45 42 36 22 21 16 4 3 P15 387 363 346 340 306 271 265 263 231 220 205 149 146 137 122 115 91 88 81 70 65 56 37 30 11 8 P19 372 345 320 280 257 254 251 240 219 216 203 136 129 106 105 90 87 2 1 P3 382 295 258 252 248 182 171 P4 391 355 351 335 317 304 267 222 200 165 163 120 109 93 P1 P2 P5 P6 P7 P9 P10 P11 P12 P13 P14 P17 P18 |

Table 13 is a table illustrating indexes of information bits and indexes of CRC bits corresponding to the interleaving result of the interleaver in a case in which the interleaver is designed on the basis of the disclosure when nDCRC=6, Kmin=9, Kmax=400, and j=8. Since Table 13 is a case where j=8 as previously assumed, the multi-interleaver 313 may correspond to a case having eight constituent interleavers therein.

TABLE 13

|  |  |
|---|---|
| [9, 50] | 49 48 47 44 38 32 28 27 25 22 16 14 13 12 10 9 8 7 5 4 1 P9 45 40 39 33 26 24 23 20 17 11 P5 50 29 15 6 2 P10 43 36 21 19 18 3 P8 37 31 P4 46 P19 42 41 35 34 30 P1 P2 P3 P6 P7 P11 P12 P13 P14 P15 P16 P17 P18 |
| [51, 100] | 100 97 96 91 89 88 87 82 75 70 69 68 67 62 61 59 56 53 52 49 48 43 42 40 39 38 35 34 28 27 26 25 24 23 21 20 18 16 12 11 10 8 7 5 4 2 1 P11 99 92 85 78 77 76 72 65 63 60 57 41 37 32 31 30 29 22 17 9 P7 95 86 80 73 64 58 55 46 45 36 14 P18 98 83 79 51 44 13 P10 93 81 74 71 33 P3 90 66 15 3 P2 94 84 54 50 47 19 6 P1 P4 P5 P6 P8 P9 P12 P13 P14 P15 P16 P17 P19 |
| [101, 150] | 149 146 142 139 138 137 135 132 128 127 126 122 120 118 117 115 113 111 110 107 106 103 102 99 92 91 90 88 87 85 82 81 80 70 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 133 129 101 49 45 26 16 P10 140 116 65 53 P2 144 134 104 100 97 69 56 P1 P4 P5 P6 P8 P9 P12 P13 P14 P15 P16 P17 P19 |
| [151, 200] | 200 198 197 196 195 193 190 189 188 185 184 181 180 179 175 174 171 170 169 168 164 162 161 160 159 153 149 147 141 134 133 131 129 128 127 126 122 116 113 112 109 108 107 102 101 100 98 97 93 92 91 90 89 88 87 84 78 76 74 73 72 70 66 64 61 60 47 44 39 38 36 34 33 32 25 21 18 15 13 11 10 9 8 7 6 P16 187 186 183 178 176 173 166 165 163 156 146 144 143 140 137 130 119 110 106 105 103 94 85 82 79 75 71 68 65 63 62 59 56 53 50 41 31 30 29 28 27 26 24 23 20 17 14 5 4 2 1 P19 199 194 192 167 158 152 148 132 125 121 114 111 99 96 86 83 77 69 46 43 37 35 12 P15 191 177 155 151 139 136 123 117 81 80 67 57 54 48 40 22 19 P6 145 142 135 124 95 58 55 52 16 3 P2 182 172 150 45 P4 157 154 138 120 118 104 51 49 42 P1 P3 P5 P7 P8 P9 P10 P11 P12 P13 P14 P17 P18 |
| [201, 250] | 250 248 247 246 245 243 240 239 238 235 234 231 230 229 225 224 221 220 219 218 214 212 211 210 209 203 199 197 191 184 183 181 179 178 177 176 172 166 165 163 162 159 158 157 152 151 150 148 147 143 142 141 140 139 138 137 134 128 126 124 123 122 120 116 114 111 110 97 94 89 88 86 84 83 82 75 71 68 65 63 61 60 59 58 57 56 48 47 46 42 40 37 36 35 34 30 29 28 25 24 20 19 17 12 11 10 9 8 7 5 4 32 1 P16 237 236 233 228 226 223 216 215 213 206 196 194 193 190 187 180 169 160 156 155 153 144 135 132 129 125 121 118 115 113 112 100 103 100 91 80 79 78 77 76 74 73 70 67 64 55 54 52 51 49 44 41 39 38 31 27 26 23 22 14 P19 249 244 242 217 208 202 198 182 175 171 164 161 149 146 136 133 127 119 96 93 87 85 62 45 33 18 16 6 P15 227 207 204 200 192 189 188 186 174 173 168 131 105 99 95 92 43 P8 222 195 170 130 107 104 101 90 69 66 53 P3 232 145 108 102 98 32 21 P4 241 205 201 185 167 154 117 72 50 15 13 P1 P2 P5 P6 P7 P9 P10 P11 P12 P13 P14 P17 P18 |
| [251, 300] | 300 298 297 296 295 293 290 289 288 285 284 281 280 279 275 274 271 270 269 258 264 262 261 260 259 253 249 247 241 234 233 231 229 228 227 226 222 216 215 213 212 209 208 207 202 201 200 198 197 193 192 191 190 189 188 187 184 178 176 174 173 172 170 166 164 161 160 147 144 139 138 136 134 133 132 125 121 118 115 113 111 110 109 108 107 106 98 97 96 92 90 87 86 85 84 80 79 78 75 74 70 69 67 62 61 60 59 58 57 55 54 53 52 51 50 48 47 43 40 39 38 35 34 32 31 28 26 25 23 19 18 16 14 13 12 8 4 3 P16 294 287 286 277 276 272 267 266 263 257 254 245 244 242 |

TABLE 13-continued

| | |
|---|---|
| | 238 225 220 217 211 206 204 203 199 195 186 185 183 180 177 171 169 163 162 157 154 151 148 142 137 131 130 129 128 127 126 124 122 115 112 105 103 102 100 99 95 89 88 82 77 73 71 65 56 46 45 44 42 33 29 24 20 9 2 1 P17 299 291 282 265 250 248 232 230 223 214 210 194 179 175 167 165 145 140 135 119 114 93 91 81 76 68 63 49 41 36 27 17 15 5 P1 278 258 255 251 243 240 239 237 225 224 219 182 156 150 146 143 94 22 11 P9 273 246 221 181 158 155 152 141 120 117 104 37 30 7 6 P4 283 196 159 153 149 83 72 P5 292 256 252 236 218 205 168 123 101 66 64 21 10 P2 P3 P6 P7 P8 P10 P11 P12 P13 P14 P15 P18 P19 |
| [301, 350] | 350 348 347 346 345 343 340 339 338 335 334 331 330 329 325 324 321 320 319 318 314 312 311 310 309 303 299 297 291 284 283 281 279 278 277 276 272 266 265 263 262 259 258 257 252 251 250 248 247 243 242 241 240 239 238 237 234 228 226 224 223 222 220 216 214 211 210 197 194 189 188 186 184 183 182 175 171 168 165 163 161 160 159 158 157 156 148 147 146 142 140 137 136 135 134 130 129 128 125 124 120 119 117 112 111 110 109 108 107 105 104 103 102 101 100 98 97 93 90 89 88 85 84 82 81 78 76 75 73 69 68 66 64 63 62 58 54 53 50 47 42 39 36 34 32 28 27 25 24 23 21 19 17 16 14 13 12 11 9 8 7 5 4 2 1 P16 344 337 336 327 326 322 317 316 313 307 304 295 294 292 288 285 270 267 261 256 254 253 249 245 236 235 233 230 227 221 219 213 212 207 204 201 198 192 187 181 180 179 178 177 176 174 172 166 162 155 153 152 150 149 145 139 138 132 127 123 121 115 106 96 95 94 92 83 79 74 70 59 52 51 49 46 45 43 37 33 29 20 18 6 P17 349 341 332 315 300 298 282 280 273 264 260 244 229 225 217 215 195 190 185 169 164 143 141 131 126 118 113 99 91 86 77 67 65 55 48 40 35 26 22 15 10 3 P1 328 308 305 301 293 290 289 287 275 274 269 232 206 200 196 193 144 72 61 31 30 P9 323 296 271 231 208 205 202 191 170 167 154 87 80 57 56 41 38 P4 333 246 209 203 199 133 122 P5 342 306 302 286 268 255 218 173 151 116 114 71 60 44 P2 P3 P6 P7 P8 P10 P11 P12 P13 P14 P15 P18 P19 |
| [351, 400] | 400 397 393 390 389 388 386 383 379 378 377 373 371 369 368 365 364 362 361 358 357 354 353 350 343 342 341 339 338 336 333 332 331 330 328 327 325 324 323 321 319 318 313 311 310 308 302 301 298 291 289 288 286 285 283 282 281 275 270 269 266 262 259 256 255 250 249 246 245 243 242 236 235 234 232 226 224 223 221 217 215 214 212 210 208 207 206 204 202 201 196 195 193 191 189 188 184 183 181 180 177 174 173 172 169 166 161 160 159 158 157 155 154 150 148 145 144 143 142 141 134 132 131 130 127 125 124 123 121 119 118 116 113 112 111 110 107 104 103 102 101 97 95 94 92 89 86 85 83 80 79 75 74 72 71 68 63 62 59 57 55 53 50 47 46 41 40 39 35 33 32 29 28 26 25 24 20 19 18 17 15 13 12 10 9 7 6 5 P8 399 398 395 394 392 384 381 380 376 370 367 365 360 356 352 349 348 347 344 337 329 326 322 314 312 309 307 305 303 300 299 296 294 293 290 279 278 277 274 272 268 264 260 253 244 241 239 238 237 230 229 228 227 218 213 199 194 192 190 186 185 178 176 175 168 167 164 162 156 151 140 139 138 135 133 117 114 99 98 96 84 76 64 61 60 54 52 49 48 45 44 43 42 36 23 22 21 16 4 3 P15 396 385 375 374 359 334 316 315 297 292 287 284 276 273 261 247 233 225 211 209 198 197 187 179 170 153 152 147 128 125 108 100 82 78 77 73 69 67 66 58 51 38 34 31 27 14 P16 387 363 346 340 306 271 265 263 231 220 205 149 146 137 122 115 91 88 81 70 65 56 37 30 11 8 P19 372 345 320 280 257 254 251 240 219 216 203 136 129 106 105 90 87 2 1 P3 382 295 258 252 248 182 171 P4 391 355 351 335 317 304 257 222 200 165 163 120 109 93 P1 P2 P5 P6 P7 P9 P10 P11 P12 P13 P14 P17 P18 |

Table 14 is a table illustrating indexes of information bits and indexes of CRC bits corresponding to the interleaving result of the interleaver in a case in which the interleaver is designed on the basis of the disclosure when nDCRC=7, Kmin=9, Kmax=200, and j=1. Since Table 14 is a case where j=1 as previously assumed, the multi-interleaver 313 may correspond to a case having one component interleaver therein.

TABLE 14

199 196 192 189 188 187 185 182 178 177 176 172 170 168 167 165 163 161 160 157 156 153 152 149 142 141 140 138 137 135 132 131 130 129 127 126 124 123 122 120 118 117 112 110 109 107 101 100 97 90 88 87 85 84 82 81 80 74 69 68 65 61 58 55 54 49 48 45 44 42 41 35 34 33 31 25 23 22 20 16 14 13 11 9 7 6 5 3 1 P7 200 197 191 175 169 162 159 148 143 139 134 128 125 121 116 111 108 105 104 102 98 96 93 92 83 79 77 75 73 71 64 63 60 57 56 52 51 47 46 40 39 38 36 29 28 27 19 12 10 P11 195 186 180 173 164 158 155 146 145 136 114 91 86 78 72 70 67 62 43 32 30 26 17 8 4 P18 193 181 174 171 144 133 113 94 89 59 53 37 24 18 15 P3 198 183 179 151 99 95 76 66 P10 190 184 147 115 21 P16 103 50 P6 194 166 154 150 119 106 2 P1 P2 P4 P5 P8 P9 P12 P13 P14 P15 P17 P19

Table 15 is a table illustrating indexes of information bits and indexes of CRC bits corresponding to the interleaving result of the interleaver in a case in which the interleaver is designed on the basis of the disclosure when nDCRC=7, Kmin=9, Kmax=200, and j=2. Since Table 15 is a case where j=2 as previously assumed, the multi-interleaver 313 may correspond to a case having two component interleavers therein.

TABLE 15

| | |
|---|---|
| [9, 100] | 100 97 96 91 89 88 87 82 75 70 69 68 67 62 61 59 56 53 52 49 48 43 42 40 39 38 35 34 28 27 26 25 24 23 21 20 18 16 12 11 10 8 7 5 4 2 1 P11 99 92 85 78 77 76 72 65 63 60 57 41 37 32 31 30 29 22 |

TABLE 15-continued

|  |  |
|---|---|
|  | 17 9 P7 95 86 80 73 64 58 55 46 45 36 14 P18 98 83 79 51 44 13 P10 90 81 71 66 33 15 3 P2 74 47 19 6 P19 84 P6 94 93 54 50 P1 P3 P4 P5 P8 P9 P12 P13 P14 P15 P16 P17 |
| [101, 200] | 199 196 192 189 188 187 185 182 178 177 176 172 170 168 167 165 163 161 160 157 156 153 152 149 142 141 140 138 137 135 132 131 130 129 127 126 124 123 122 120 118 117 112 110 109 107 101 100 97 90 88 87 85 84 82 81 80 74 69 68 65 61 58 55 54 49 48 45 44 42 41 35 34 33 31 25 23 22 20 16 14 13 11 9 7 6 5 3 1 P7 200 197 191 175 169 162 159 148 143 139 134 128 125 121 116 111 108 105 104 102 98 96 93 92 83 79 77 75 73 71 64 63 60 57 56 52 51 47 46 40 39 38 36 29 28 27 19 12 10 P11 195 186 180 173 164 158 155 146 145 136 114 91 86 78 72 70 67 62 43 32 30 26 17 8 4 P18 193 181 174 171 144 133 113 94 89 59 53 37 24 18 15 P3 198 183 179 151 99 95 76 66 P10 190 184 147 115 21 P16 103 50 P6 194 166 154 150 119 106 2 P1 P2 P4 P5 P8 P9 P12 P13 P14 P15 P17 P19 |

Table 16 is a table illustrating indexes of information bits and indexes of CRC bits corresponding to the interleaving result of the interleaver in a case in which the interleaver is designed on the basis of the disclosure when nDCRC=7, Kmin=9, Kmax=200, and j=4. Since Table 16 is a case where j=4 as previously assumed, the multi-interleaver 313 may correspond to a case having four constituent interleavers therein.

TABLE 16

| | |
|---|---|
| [9, 50] | 49 48 47 44 38 32 28 27 25 22 16 14 13 12 10 9 8 7 5 4 1 P9 45 40 39 33 26 24 23 20 17 11 P5 50 29 15 6 2 P10 43 36 21 19 18 3 P8 37 31 P4 46 P19 41 P11 42 35 34 30 P1 P2 P3 P6 P7 P12 P13 P14 P15 P16 P17 P18 |
| [51, 100] | 100 97 96 91 89 88 87 82 75 70 69 68 67 62 61 59 56 53 52 49 48 43 42 40 39 38 35 34 28 27 26 25 24 23 21 20 18 16 12 11 10 8 7 5 4 2 1 P11 99 92 85 78 77 76 72 65 63 60 57 41 37 32 31 30 29 22 17 9 P7 95 86 80 73 64 58 55 46 45 36 14 P18 98 83 79 51 44 13 P10 93 81 74 71 33 P3 90 66 15 3 P2 94 19 P14 84 54 50 47 6 P1 P4 P5 P6 P8 P9 P12 P13 P15 P16 P17 P19 |
| [101, 150] | 149 146 142 139 138 137 135 132 128 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 133 129 101 49 45 26 16 P10 140 134 97 65 P16 53 P6 144 116 104 100 69 56 P1 P2 P4 P5 P8 P9 P12 P13 P14 P15 P17 P19 |
| [151, 200] | 200 198 197 196 195 193 190 189 188 185 184 181 180 179 176 174 171 170 169 168 164 162 161 160 159 153 149 147 141 134 133 131 129 128 127 126 122 116 115 113 112 109 108 107 102 101 100 98 97 93 92 91 90 89 88 87 84 78 76 74 73 72 70 66 64 61 60 47 44 39 38 36 34 33 32 25 21 18 15 13 11 10 9 8 7 6 P16 187 186 183 178 176 173 166 165 163 156 146 144 143 140 137 130 119 110 106 105 103 94 85 82 79 75 71 68 65 63 62 59 56 53 50 41 31 30 29 28 27 26 24 23 20 17 14 5 4 2 1 P19 199 194 192 167 158 152 148 132 125 121 114 111 99 96 86 83 77 69 45 43 37 35 12 P15 191 177 155 151 139 136 123 117 81 80 67 57 54 48 40 22 19 P6 145 142 135 124 95 58 55 52 16 3 P2 182 172 150 45 P4 118 104 49 P18 157 154 138 120 51 42 P1 P3 P5 P7 P8 P9 P10 P11 P12 P13 P14 P17 |

Table 17 is a table illustrating indexes of information bits and indexes of CRC bits corresponding to the interleaving result of the interleaver in a case in which the interleaver is designed on the basis of the disclosure when nDCRC=7, Kmin=9, Kmax=200, and j=8. Since Table 17 is a case where j=8 as previously assumed, the multi-interleaver 313 may correspond to a case having eight constituent interleavers therein.

TABLE 17

| | |
|---|---|
| [9, 25] | 24 23 22 19 13 7 3 2 P9 20 15 14 8 1 P5 25 4 P10 18 11 P8 12 6 P4 10 5 P18 16 P14 21 17 9 P1 P2 P3 P6 P7 P11 P12 P13 P15 P16 P17 P19 |
| [26, 50] | 49 48 47 44 38 32 28 27 25 22 16 14 13 12 10 9 8 7 5 4 1 P9 45 40 39 33 26 24 23 20 17 11 P5 50 29 15 6 2 P10 43 36 21 19 18 3 P8 37 31 P4 46 P19 41 P11 42 35 34 30 P1 P2 P3 P6 P7 P12 P13 P14 P15 P16 P17 P18 |
| [51, 75] | 75 72 71 66 64 63 62 57 50 45 44 43 42 37 36 34 31 28 27 24 23 18 17 15 14 13 10 9 3 2 1 P11 74 67 60 53 52 51 47 40 38 35 32 16 12 7 6 5 4 P7 70 61 55 48 39 33 30 21 20 11 P18 68 56 49 46 19 8 P3 69 65 26 P14 73 58 41 P2 54 P10 59 29 25 22 P1 P4 P5 P6 P8 P9 P12 P13 P15 P16 P17 |
| [76, 100] | 100 97 96 91 89 88 87 82 75 70 69 68 67 62 61 59 56 53 52 49 48 43 42 40 39 38 35 34 28 27 26 25 24 23 21 20 18 16 12 11 10 8 7 5 4 2 1 P11 99 92 85 78 77 76 72 65 63 90 57 41 37 32 31 30 29 22 17 9 P7 95 86 80 73 64 58 55 46 45 36 14 P18 98 83 79 51 44 13 P10 93 81 74 71 33 P3 90 66 15 3 P2 94 19 P14 84 54 50 47 6 P1 P4 P5 P6 P8 P9 P12 P13 P15 P16 P17 P19 |
| [101, 125] | 124 121 117 114 113 112 110 107 103 102 101 97 95 93 92 90 83 86 85 82 81 78 77 74 67 66 65 63 62 60 57 56 55 54 52 51 49 48 47 45 43 42 37 35 34 32 26 25 22 15 13 12 10 9 7 6 5 P7 125 122 116 100 94 87 84 73 68 64 59 53 50 46 41 36 33 30 29 27 23 21 18 17 8 4 2 P11 120 111 105 98 89 |

TABLE 17-continued

|  |  |
|---|---|
|  | 83 80 71 70 61 39 16 11 3 P18 118 106 99 96 69 58 38 19 14 P3 123 108 104 76 24 20 1 P10 115 109 72 40 P16 28 P6 119 91 79 75 44 31 P1 P2 P4 P5 P8 P9 P12 P13 P14 P15 P17 P19 |
| [126, 150] | 149 146 142 139 138 137 135 132 128 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 140 134 129 97 65 26 16 P16 133 101 53 49 P6 45 P10 144 116 104 100 69 56 P1 P2 P4 P5 P8 P9 P12 P13 P14 P15 P17 P19 |
| [151, 175] | 173 171 169 163 162 161 160 159 156 154 152 151 149 147 146 142 141 139 138 137 136 132 129 122 120 119 117 116 113 110 106 104 103 102 95 92 88 86 83 82 81 79 78 76 74 70 67 66 65 61 60 58 55 52 51 48 47 46 44 41 39 38 37 36 35 32 29 26 23 17 14 12 7 6 5 4 3 2 1 P17 174 172 166 165 164 157 155 150 145 144 140 135 125 123 109 107 105 98 91 89 85 84 77 73 69 68 64 63 54 50 49 42 40 20 15 10 9 8 P1 175 170 168 143 134 128 124 108 101 97 90 87 75 72 62 59 53 45 22 19 13 11 P16 167 153 131 127 115 112 99 93 57 56 43 33 30 24 16 P7 121 118 111 100 71 34 31 28 P3 158 148 126 21 P5 94 80 25 P19 133 130 114 96 27 18 P2 P4 P6 P8 P9 P10 P11 P12 P13 P14 P15 P18 |
| [176, 200] | 200 198 197 196 195 193 190 189 188 185 194 181 180 179 175 174 171 170 169 168 154 162 161 160 159 153 149 147 141 134 133 131 129 128 127 126 122 116 115 113 112 109 108 107 102 101 100 98 97 93 92 91 90 89 88 87 84 78 76 74 73 72 70 66 64 61 60 47 44 39 38 36 34 33 32 25 21 18 15 13 11 10 9 8 7 6 P16 187 186 183 178 176 173 166 165 163 156 146 144 143 140 137 130 119 110 106 105 103 94 85 82 79 75 71 68 65 63 62 59 56 53 50 41 31 30 29 28 27 26 24 23 20 17 14 5 4 2 1 P19 199 194 192 157 158 152 148 132 125 121 114 111 99 96 86 83 77 69 46 43 37 35 12 P15 191 177 155 151 139 136 123 117 81 80 67 57 54 48 40 22 19 P6 145 142 135 124 95 58 55 52 16 3 P2 162 172 150 45 P4 118 104 49 P18 157 154 138 120 51 42 P1 P3 P5 P7 P8 P9 P10 P11 P12 P13 P14 P17 |

Table 18 is a table illustrating indexes of information bits and indexes of CRC bits corresponding to the interleaving result of the interleaver in a case in which the interleaver is designed on the basis of the disclosure when nDCRC=7, Kmin=9, Kmax=300, and j=1. Since Table 18 is a case where j=1 as previously assumed, the multi-interleaver 313 may correspond to a case having one component interleaver therein.

TABLE 18

299 296 292 289 288 287 285 282 278 277 276 272 270 268 267 265 263 261 260 257 256 253 252 249 242 241 240 238 237 235 232 231 230 229 227 226 224 223 222 220 218 217 212 210 209 207 201 200 197 190 188 187 185 184 182 181 180 174 169 168 165 161 158 155 154 149 148 145 144 142 141 135 134 133 131 125 123 122 120 116 114 113 111 109 107 106 105 103 101 100 95 94 92 90 88 87 83 82 80 79 76 73 72 71 68 65 60 59 58 57 56 54 53 49 47 44 43 42 41 40 33 31 30 29 26 25 23 22 20 18 17 15 12 11 10 9 6 3 2 1 P7 300 297 291 275 269 262 259 248 243 239 234 228 225 221 216 211 208 205 204 202 198 196 193 192 183 179 177 175 173 171 164 163 160 157 156 152 151 147 146 140 139 138 136 129 128 127 119 112 103 99 97 96 91 89 86 85 81 74 70 69 67 64 63 62 61 52 48 45 37 36 35 32 28 24 19 13 4 P11 295 286 280 273 264 258 255 246 245 236 214 191 186 178 172 170 167 162 143 132 130 126 117 108 104 98 93 78 75 66 51 46 39 34 21 14 P18 298 283 279 251 244 213 199 195 194 189 176 166 137 115 77 55 27 16 P10 290 281 271 266 233 215 203 50 5 P2 293 274 159 153 124 118 84 7 P3 284 247 121 38 8 P16 294 254 250 219 206 150 102 P1 P4 P5 P6 P8 P9 P12 P13 P14 P15 P17 P19

Table 19 is a table illustrating indexes of information bits and indexes of CRC bits corresponding to the interleaving result of the interleaver in a case in which the interleaver is designed on the basis of the disclosure when nDCRC=7, Kmin=9, Kmax=300, and j=2. Since Table 19 is a case where j=2 as previously assumed, the multi-interleaver 313 may correspond to a case having two component interleavers therein.

TABLE 19

| [9, 150] | 149 146 142 139 138 137 135 132 128 127 126 122 120 118 117 115 113 111 110 107 106 103 102 99 92 91 90 88 87 75 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 68 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 133 129 101 49 45 26 16 P10 140 134 97 65 P16 53 P6 144 116 104 100 69 56 P1 P2 P4 P5 P8 P9 P12 P13 P14 P15 P17 P19 |
|---|---|
| [151, 300] | 300 298 297 296 295 293 290 289 288 285 284 281 280 279 275 274 271 270 269 268 264 262 261 260 259 253 249 247 241 234 233 231 229 228 227 226 222 216 215 213 212 209 208 207 202 201 200 198 197 193 192 191 190 189 188 187 184 178 176 174 173 172 170 166 164 161 160 147 144 139 138 136 134 133 132 125 121 118 115 113 111 110 109 108 107 106 98 97 96 92 90 87 86 85 84 80 79 78 75 74 70 69 67 62 61 60 59 58 57 55 54 53 52 51 50 48 47 43 40 39 38 35 34 32 31 28 26 25 23 19 18 16 14 13 12 8 4 3 P16 287 286 283 278 276 273 266 265 263 256 246 244 243 240 237 230 219 210 206 205 203 194 185 182 179 175 171 169 165 163 162 159 156 153 150 141 131 |

TABLE 19-continued 130 129 128 127 126 124 123 120 117 114 105 104 102 101 99 94 91 89 88 81 77 76 73 72 64 49 46 45 44 42 41 37 22 15 11 1 P19 299 294 292 267 268 252 248 232 225 221 214 211 199 196 186 183 177 169 149 143 137 135 112 95 88 68 66 56 83 30 27 24 17 7 2 P16 277 257 254 250 242 239 238 236 224 223 218 181 155 149 145 142 93 21 10 P8 272 245 220 180 157 154 151 140 119 116 103 36 29 6 5 P3 282 195 158 152 148 82 71 P4 291 235 204 63 P11 255 251 217 167 122 100 65 20 9 P1 P2 P5 P6 P7 P9 P10 P12 P13 P14 P17 P18

Table 20 is a table illustrating indexes of information bits and indexes of CRC bits corresponding to the interleaving result of the interleaver in a case in which the interleaver is designed on the basis of the disclosure when nDCRC=7, Kmin=9, Kmax=300, and j=4. Since Table 20 is a case where j=4 as previously assumed, the multi-interleaver 313 may correspond to a case having four constituent interleavers therein.

TABLE 20

| | |
|---|---|
| [9, 75] | 74 73 72 69 63 57 63 52 50 47 41 39 38 37 35 34 33 32 30 29 26 25 23 22 20 18 17 16 15 14 13 12 8 5 4 3 1 P9 70 65 64 58 51 49 48 45 42 36 21 10 7 2 P5 75 54 40 31 27 24 19 9 6 P10 66 62 59 55 44 P1 71 43 28 P11 46 11 P6 67 P12 68 61 60 56 P2 P3 P4 P7 P8 P13 P14 P15 P16 P17 P18 P19 |
| [76, 150] | 149 146 142 139 135 137 135 132 125 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 107 6 2 1 P11 145 136 130 123 114 108 105 96 95 86 64 41 36 28 22 20 17 12 P18 143 131 124 121 94 83 63 44 39 9 3 P3 148 133 129 101 49 45 26 16 P10 140 134 97 65 P16 53 P6 144 116 104 100 69 56 P1 P2 P4 P5 P8 P9 P12 P13 P14 P15 P17 P19 |
| [151, 225] | 225 223 222 221 220 218 215 214 213 210 209 206 205 204 200 199 196 195 194 193 189 187 186 185 184 178 174 172 166 159 158 156 154 153 152 151 147 141 140 138 137 134 133 132 127 126 125 123 122 118 117 116 115 114 113 112 109 103 101 99 98 97 95 91 89 86 85 72 69 64 63 61 59 58 57 50 46 43 40 38 36 35 34 33 32 31 23 22 21 17 15 12 11 10 9 5 4 3 P16 212 211 208 203 201 198 191 190 188 181 171 169 168 165 162 155 144 135 131 130 128 119 110 107 104 100 96 93 90 88 87 84 81 78 75 66 56 55 54 53 52 51 49 48 46 42 39 30 29 27 26 24 19 16 14 13 6 2 1 P19 224 219 217 192 183 177 173 157 150 146 139 136 124 121 111 108 102 94 71 68 62 60 37 20 8 P15 216 202 180 176 164 161 148 142 106 105 92 82 79 13 65 47 44 25 18 7 P6 170 167 160 149 120 83 80 77 41 28 P2 207 197 175 70 P4 143 129 74 P18 182 179 163 145 76 67 P1 P3 P5 P7 P8 P9 P10 P11 P12 P13 P14 P17 |
| [226, 300] | 300 298 297 296 295 293 290 289 288 285 284 281 280 279 275 274 271 270 269 268 264 262 261 260 259 253 249 247 241 234 233 231 229 228 227 226 222 216 215 213 212 209 208 207 202 201 200 198 197 193 192 191 190 189 188 187 184 178 176 174 173 172 170 166 164 161 160 147 144 139 138 136 134 133 132 125 121 118 115 113 111 110 109 108 107 106 98 97 96 92 90 87 86 85 84 80 79 78 75 74 70 69 67 62 61 60 59 58 57 55 54 53 52 51 50 48 47 43 40 39 38 35 34 32 31 28 26 25 23 19 18 16 14 13 12 8 4 3 P16 294 287 286 277 276 272 267 266 263 257 254 245 244 242 238 235 220 217 211 206 204 203 199 195 186 185 183 180 177 171 169 163 162 157 154 151 148 142 137 131 130 129 128 127 126 124 122 116 112 105 103 102 100 99 95 89 88 82 77 73 71 65 56 46 45 44 42 33 29 24 20 9 2 1 P17 299 291 282 265 250 248 232 230 223 214 210 194 179 175 167 165 145 140 135 119 114 93 91 81 76 68 63 49 41 36 27 17 15 5 P1 278 258 255 251 243 240 239 237 225 224 219 182 156 150 146 143 94 22 11 P9 273 246 221 181 158 155 152 141 120 117 104 37 30 7 6 P4 283 196 159 153 149 83 72 P5 292 236 205 64 P12 256 252 218 168 123 101 66 21 10 P2 P3 P6 P7 P8 P10 P11 P13 P14 P15 P18 P19 |

Table 21 is a table illustrating indexes of information bits and indexes of CRC bits corresponding to the interleaving result of the interleaver in a case in which the interleaver is designed on the basis of the disclosure when nDCRC=7, Kmin=9, Kmax=300, and j=8. Since Table 21 is a case where j=8 as previously assumed, the multi-interleaver 313 may correspond to a case having eight constituent interleavers therein.

TABLE 21

| | |
|---|---|
| [9, 37] | 36 35 34 31 25 19 15 14 12 9 3 1 P9 32 27 26 20 11 10 7 4 P5 37 16 2 P10 30 23 8 6 5 P8 24 18 P4 33 P19 28 P11 29 22 21 17 P1 P2 P3 P6 P7 P12 P13 P14 P15 P16 P17 P18 |
| [38, 75] | 75 72 71 66 64 63 62 57 50 45 44 43 42 37 36 34 81 28 27 24 23 18 17 15 14 13 10 9 3 2 1 P11 74 67 60 53 52 51 47 40 28 35 32 16 12 7 6 5 4 P7 70 61 55 48 39 33 30 21 20 11 P18 73 58 54 26 19 P10 65 56 46 41 8 P2 49 22 P19 68 P3 69 59 29 25 P1 P4 P5 P6 P8 P9 P12 P13 P14 P15 P16 P17 |
| [76, 112] | 111 109 107 101 100 99 98 97 94 92 90 89 87 85 84 80 74 77 76 75 74 70 67 60 58 57 55 54 51 48 44 42 41 40 33 30 26 24 21 20 19 17 16 14 12 8 5 4 3 P18 112 108 103 82 81 73 71 68 65 64 61 52 50 47 46 39 38 37 36 35 32 28 23 22 13 10 9 2 P11 104 88 72 69 53 49 43 34 29 P7 110 95 91 63 56 25 11 7 6 1 P10 105 93 86 83 45 P3 102 95 59 27 P16 15 P6 106 78 66 62 31 18 P1 P2 P4 P5 P8 P9 P12 P13 P14 P15 P17 P19 |

TABLE 21-continued

| Range | Sequence |
|---|---|
| [113, 150] | 149 146 142 139 138 137 135 132 128 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 140 134 129 97 65 26 16 P16 133 101 53 49 P6 45 P10 144 116 104 100 69 56 P1 P2 P4 P5 P8 P9 P12 P13 P14 P15 P17 P19 |
| [151, 187] | 187 185 184 183 182 180 177 176 175 172 171 168 167 166 162 161 158 157 156 155 151 149 148 147 146 140 136 134 128 121 120 118 116 115 114 113 109 108 102 100 99 96 95 94 89 88 87 85 84 80 79 78 77 76 75 74 71 65 63 61 60 59 57 53 51 48 47 34 31 26 25 23 21 20 19 12 8 5 2 P16 174 473 170 165 163 160 153 152 150 143 133 131 130 127 124 117 106 97 93 92 90 81 72 69 66 62 58 55 52 50 49 46 43 40 37 28 18 17 16 15 14 13 11 10 7 4 1 P19 186 181 179 154 145 139 135 119 112 108 101 98 86 83 73 70 64 56 33 30 24 22 P15 178 164 142 138 126 123 110 104 68 67 54 44 41 35 27 9 6 P6 132 129 122 111 82 45 42 39 3 92 169 159 137 32 P4 105 91 36 P18 144 141 125 107 38 29 P1 P3 P5 P7 P8 P9 P10 P11 P12 P13 P14 P17 |
| [187, 226] | 225 223 222 221 220 218 215 214 213 210 209 206 205 204 200 199 196 195 194 193 189 187 186 185 184 178 174 172 166 159 158 156 154 153 152 151 147 141 140 138 137 134 133 132 127 126 125 123 122 118 117 116 115 114 113 112 109 103 101 99 98 97 95 91 89 86 85 72 69 64 63 61 59 58 57 50 46 43 40 38 36 35 34 33 32 31 23 22 21 17 15 12 11 10 9 5 4 3 P16 212 211 208 203 201 198 191 190 188 181 171 169 168 165 162 155 144 135 131 130 128 119 110 107 104 100 96 93 90 88 87 84 81 78 75 66 56 55 54 53 52 51 49 48 45 42 39 30 29 27 26 24 19 16 14 13 6 2 1 P19 224 219 217 192 183 177 173 157 150 146 139 136 124 121 111 108 102 94 71 68 62 60 37 20 8 P15 202 182 179 175 167 164 163 161 149 148 143 106 80 74 70 67 18 P8 197 170 145 105 82 79 76 65 44 41 28 P3 207 120 83 77 73 7 P4 216 160 129 P11 180 176 142 92 47 25 P1 P2 P5 P6 P7 P9 P10 P12 P13 P14 P17 P18 |
| [226, 262] | 262 260 259 258 257 255 252 251 250 247 246 243 242 241 237 236 233 232 231 230 226 224 223 222 221 215 211 209 203 196 195 193 191 190 189 188 184 178 177 175 174 171 170 169 164 163 162 160 159 155 154 153 152 151 150 149 146 140 138 136 135 134 132 128 126 123 122 109 106 101 100 98 96 95 94 87 83 80 77 75 73 72 71 70 69 68 60 59 58 54 52 49 48 47 46 42 41 40 37 36 32 31 29 24 23 22 21 20 19 17 16 15 14 13 12 10 9 5 2 1 P16 256 249 248 238 238 234 229 228 225 219 216 207 205 204 200 197 182 179 173 168 166 165 161 157 148 147 145 142 139 133 131 125 124 119 116 113 110 104 99 93 92 91 90 89 88 86 84 78 74 67 65 64 52 61 57 51 50 44 39 35 33 27 18 8 7 8 4 P17 261 253 244 227 212 210 194 192 185 176 172 156 141 137 129 127 107 102 97 81 76 55 53 43 38 30 25 11 3 P1 240 220 217 213 205 202 201 199 187 186 181 144 118 112 108 105 56 P9 235 208 183 143 120 117 114 103 82 79 66 P4 245 158 121 115 111 45 34 P5 254 198 167 26 P12 218 214 180 130 85 63 28 P2 P3 P6 P7 P8 P10 P11 P13 P14 P15 P18 P19 |
| [263, 300] | 300 298 297 296 295 293 290 289 288 285 284 281 280 279 275 274 271 270 269 268 264 262 261 260 259 253 249 247 241 234 233 231 229 223 227 226 222 216 215 213 212 209 208 207 202 201 200 198 197 193 192 191 190 189 188 187 184 178 176 174 173 172 170 166 164 161 160 147 144 139 133 136 131 133 132 125 121 118 115 113 111 110 109 108 107 106 98 97 96 92 90 87 86 85 84 80 79 78 75 74 70 69 67 62 61 60 59 58 57 55 54 53 52 51 50 48 47 43 40 39 38 35 34 32 31 28 26 25 23 19 18 16 14 13 12 8 4 3 P16 294 287 286 277 276 272 267 266 263 257 254 245 244 242 238 235 220 217 211 206 204 203 199 195 186 185 183 180 177 171 169 163 162 157 154 151 148 142 137 131 130 129 123 127 126 124 122 116 112 105 103 102 100 99 95 89 88 82 77 73 71 65 56 46 45 44 42 33 29 21 20 9 2 1 P17 299 291 282 265 250 248 232 230 223 214 210 194 179 173 167 165 145 140 135 119 114 93 91 81 76 68 63 49 41 36 27 17 15 5 P1 278 258 255 251 243 240 239 237 225 224 219 182 156 150 146 143 94 22 11 P9 273 246 221 181 158 155 152 141 120 117 104 37 30 7 6 P4 283 196 159 153 149 83 72 P5 292 236 205 64 P12 256 252 218 168 123 101 66 21 10 P2 P3 P6 P7 P8 P10 P11 P13 P14 P15 P18 P19 |

Table 22 is a table illustrating indexes of information bits and indexes of CRC bits corresponding to the interleaving result of the interleaver in a case in which the interleaver is designed on the basis of the disclosure when nDCRC=7, Kmin=9, Kmax=400, and j=1. Since Table 22 is a case where j=2 as previously assumed, the multi-interleaver 313 may correspond to a case having two constituent interleavers therein.

TABLE 22

400 398 397 396 395 393 390 389 388 385 384 381 380 379 375 374 371 370 369 368 364 362 361 360 359 353 349 347 341 334 333 331 329 328 327 326 322 316 315 313 312 309 308 307 302 301 300 298 297 293 292 291 290 289 288 287 284 278 276 274 273 272 270 266 264 261 260 247 244 239 238 236 234 233 232 223 221 218 215 213 211 210 209 208 207 206 198 197 196 192 190 187 186 185 184 180 179 178 175 174 170 169 167 162 161 160 159 158 157 155 154 153 152 151 150 148 147 143 140 139 138 135 134 132 131 128 126 125 123 119 118 116 114 113 112 108 104 103 100 97 92 89 86 84 82 78 77 75 74 73 71 69 67 66 64 63 62 61 59 58 57 55 54 52 51 50 49 48 46 44 43 41 40 39 38 34 32 31 27 26 25 24 23 19 18 15 14 13 12 9 5 P16 387 386 383 378 376 373 366 365 363 356 346 344 343 340 337 330 319 310 306 305 303 294 285 282 279 275 271 268 265 263 262 259 256 253 250 241 231 230 229 228 227 226 224 223 220 217 214 205 204 202 201 199 194 191 189 188 181 177 176 173 172 164 149 146 145 144 142 141 137 122 115 111 101 98 95 94 91 88 85 81 72 70 68 65 56 53 37 36 35 33 30 28 21 16 11 8 6 3 P19 399 394 392 367 358 352 348 332 325 321 314 311 299 296 286 283 277 269 246 213 237 235 212 195 183 168 166 156 133 130 127 124 117 107 102 99 96 83 76 60 47 45 42 22 17 4 P15 377 357 354 350 342 339 338 336 324 323 318 281 255 249 245 242 193 121 110 80 79 29 20 10 7 P8 372 345 320 280 257 254 251 240 219 216 203 136 129 106 105 90 87 2 1 P3 382 295 258 252 248 182 171 P4 391 335 304 163 P11 355 351 317 267 222 200 165 120 109 93 P1 P2 P5 P6 P7 P9 P10 P12 P13 P14 P17 P18

Table 23 is a table illustrating indexes of information bits and indexes of CRC bits corresponding to the interleaving result of the interleaver in a case in which the interleaver is designed on the basis of the disclosure when nDCRC=7, Kmin=9, Kmax=400, and j=2. Since Table 23 is a case where j=2 as previously assumed, the multi-interleaver 313 may correspond to a case having two component interleavers therein.

TABLE 23

| | |
|---|---|
| [9, 200] | 199 196 192 189 188 187 185 182 178 177 176 172 170 168 167 165 163 161 160 157 156 153 152 149 142 141 143 138 137 135 132 131 130 129 127 126 124 123 122 120 118 117 112 110 109 107 101 106 97 90 88 81 85 84 82 81 80 74 69 68 65 61 58 55 54 49 48 45 44 42 41 35 34 33 31 25 23 22 20 16 14 13 11 9 7 6 5 3 1 P7 200 197 191 175 169 162 159 148 143 139 134 128 125 121 116 111 108 105 104 102 98 96 93 92 83 79 77 75 73 71 64 63 60 57 56 52 51 47 46 40 39 38 36 29 28 27 19 12 10 P11 195 186 180 173 164 158 155 146 145 136 114 91 86 78 72 70 67 62 43 32 30 26 17 8 4 P18 193 181 174 171 144 133 113 94 89 69 53 37 24 18 15 P3 198 183 179 151 99 95 76 66 P10 190 184 147 115 21 P16 103 50 P6 194 166 154 150 119 105 2 P1 P2 P4 P5 P8 P9 P12 P13 P14 P15 P17 P19 |
| [201, 400] | 400 398 397 396 395 393 390 389 388 385 384 381 380 379 375 374 371 370 369 368 364 362 361 360 359 353 349 347 341 334 333 331 329 328 327 326 322 316 315 313 312 309 308 307 302 301 300 298 297 293 292 291 290 289 288 287 284 279 276 274 273 272 270 265 264 261 260 247 244 239 238 236 234 233 232 225 221 218 215 213 211 210 209 208 207 200 198 197 196 192 190 187 186 185 184 180 179 178 175 174 170 169 167 162 161 160 159 158 157 155 154 153 152 151 150 148 147 143 140 139 138 135 134 132 131 128 126 125 122 119 118 116 114 113 112 108 104 103 100 97 92 89 86 84 82 78 77 75 74 73 71 69 67 66 64 63 62 61 59 58 57 55 54 52 51 50 49 48 46 44 43 41 40 39 38 34 32 31 27 26 25 24 23 19 18 15 14 13 12 9 5 P16 394 387 386 377 376 372 367 366 363 357 354 345 344 342 338 335 320 317 311 306 304 303 299 295 286 285 283 280 277 271 269 263 262 257 254 251 248 242 237 231 230 229 228 227 226 224 222 216 212 205 203 202 200 199 195 189 188 182 177 173 171 165 156 146 145 144 142 133 129 124 120 109 102 101 99 96 95 93 87 83 79 70 68 56 42 37 36 35 33 29 28 22 17 7 6 4 1 P17 399 391 382 365 350 348 332 320 323 314 310 294 279 275 267 265 245 240 235 219 214 193 191 181 176 168 163 149 141 136 127 117 115 105 98 90 85 76 72 65 60 53 47 45 20 16 10 91 376 358 355 351 343 340 139 337 325 324 319 282 256 250 246 243 194 122 111 81 80 90 21 11 8 P9 373 346 321 281 258 255 252 241 220 217 204 137 130 107 106 91 88 3 2 P4 383 796 259 253 249 183 172 P5 392 336 305 164 P12 356 352 318 268 223 201 166 121 110 94 P2 P3 P6 P7 P8 P10 P11 P13 P14 P15 P18 P19 |

Table 24 is a table illustrating indexes of information bits and indexes of CRC bits corresponding to the interleaving result of the interleaver in a case in which the interleaver is designed on the basis of the disclosure when nDCRC=7, Kmin=9, Kmax=400, and j=4. Since Table 24 is a case where j=4 as previously assumed, the multi-interleaver 313 may correspond to a case having four component interleavers therein.

TABLE 24

| | |
|---|---|
| [9, 100] | 100 97 96 91 89 88 87 82 75 70 69 68 67 62 61 59 56 53 52 49 48 43 42 40 39 38 35 34 28 27 26 25 24 23 21 20 18 16 12 11 10 8 7 5 4 2 1 P11 99 92 85 78 77 76 72 65 63 60 57 41 37 32 31 30 29 22 17 9 P7 95 86 80 73 64 58 66 46 45 36 14 P18 98 83 79 51 44 13 P10 90 81 71 66 33 15 3 P2 74 47 19 6 P19 84 P6 94 93 54 50 P1 P3 P4 P5 P8 P9 P12 P13 P14 P15 P16 P17 |
| [101, 200] | 199 196 192 189 188 187 185 182 178 177 176 172 170 168 167 165 163 161 160 157 156 153 152 149 142 141 140 138 137 135 132 131 130 129 127 126 124 123 122 120 118 117 112 110 109 107 101 100 97 90 88 87 85 84 82 81 80 74 69 68 65 61 58 55 54 49 48 45 44 42 41 35 34 33 31 25 23 22 20 16 14 13 11 9 7 6 5 3 1 P7 200 197 191 175 169 162 159 148 143 139 134 128 125 121 116 111 108 105 104 102 98 96 93 92 83 79 77 75 73 71 64 63 60 57 56 52 51 47 46 40 39 38 36 29 28 27 19 12 10 P11 195 186 180 173 164 158 155 146 145 136 114 91 86 78 72 70 67 62 43 32 30 26 17 8 4 P18 193 181 174 171 144 133 113 94 89 59 53 57 24 18 15 P3 198 183 179 151 99 93 76 66 P10 190 184 147 115 21 P16 103 50 P6 194 166 154 150 119 106 2 P1 P2 P4 P5 P8 P9 P12 P13 P14 P15 P17 P19 |
| [201, 300] | 300 298 297 296 295 293 290 289 288 285 284 281 280 279 275 274 271 270 269 268 264 262 261 260 259 253 249 247 241 234 233 231 229 228 227 226 222 216 215 213 212 209 208 207 202 201 200 193 197 193 192 191 190 189 188 187 184 178 176 174 173 172 170 166 164 161 160 147 144 139 138 136 134 133 132 125 121 118 115 113 111 110 109 108 107 106 98 97 96 92 90 87 85 85 84 80 79 78 75 74 70 69 67 62 61 60 59 58 57 55 54 53 52 51 50 48 47 43 40 39 38 35 34 32 31 28 76 25 23 19 18 16 14 13 12 8 4 3 P16 294 287 286 277 276 272 267 266 263 257 254 245 244 242 238 235 220 217 211 206 204 203 199 195 186 185 183 180 177 171 169 163 162 157 154 151 148 142 137 131 130 129 128 127 126 124 122 116 112 105 103 102 100 99 95 89 88 82 77 73 71 65 56 46 45 44 42 33 29 24 20 9 2 1 P17 299 291 282 265 250 248 232 230 223 214 210 194 179 175 167 165 145 140 135 119 114 93 91 81 76 68 63 49 41 36 27 17 15 5 P1 278 258 255 251 243 240 239 237 225 224 219 182 156 150 146 143 94 22 11 P9 273 246 221 181 158 155 152 141 120 117 104 37 30 7 6 P4 283 196 159 153 149 83 72 P5 292 236 205 64 P12 256 252 218 168 123 101 66 21 10 P2 P3 P6 P7 P8 P10 P11 P13 P14 P15 P18 P19 |
| [301, 400] | 400 397 393 390 389 388 386 383 379 378 377 373 371 369 368 366 364 362 361 358 357 354 353 350 343 342 341 339 338 335 333 332 331 330 328 327 325 324 323 321 319 318 313 311 310 308 |

TABLE 24-continued 302 301 298 291 289 288 286 285 283 282 281 275 270 269 266 262 259 256 255 250 249 246 245
243 242 236 235 234 232 226 224 223 221 217 215 214 212 210 208 207 206 204 202 201 196 195
193 191 189 188 184 183 181 180 177 174 173 172 169 166 161 160 159 158 157 155 154 150 148
145 144 143 142 141 134 132 131 130 127 126 124 123 121 119 118 116 113 112 111 110 107 104
103 102 101 97 95 94 92 89 86 85 83 80 79 75 74 72 71 68 63 62 59 57 55 53 50 47 46 41 40 39 35
33 32 29 28 26 25 24 20 19 18 17 15 13 12 10 9 7 6 5 P8 398 396 395 385 384 381 380 375 374 370
360 359 349 347 334 329 326 322 316 315 312 309 307 300 297 293 292 290 287 284 278 276 274
273 272 264 261 260 247 244 239 238 233 225 218 213 211 209 198 197 192 190 187 186 185 179
178 175 170 167 162 153 152 151 147 140 139 138 135 128 125 114 108 100 84 82 78 77 73 69 67
66 64 61 58 54 52 51 43 48 44 43 38 34 31 27 23 14 P16 399 394 392 376 367 365 356 352 348 344
337 314 305 303 299 296 294 279 277 268 253 241 237 230 229 228 227 199 194 176 168 164 156
133 117 99 98 96 76 60 45 42 36 22 21 16 4 3 P15 387 363 346 340 306 271 265 263 231 220 205
149 146 137 122 115 91 88 81 70 65 56 37 30 11 8 P19 372 345 320 280 257 254 251 240 219 216
203 136 129 106 105 90 87 2 1 P3 382 295 258 252 248 182 171 P4 391 335 304 163 P11 355 351
317 267 222 200 165 120 109 93 P1 P2 P5 P6 P7 P9 P10 P12 P13 P14 P17 P18

Table 25 is a table illustrating indexes of information bits and indexes of CRC bits corresponding to the interleaving result of the interleaver in a case in which the interleaver is designed on the basis of the disclosure when nDCRC=7, Kmin=9, Kmax=400, and j=8. Since Table 25 is a case where j=8 as previously assumed, the multi-interleaver 313 may correspond to a case having eight constituent interleavers therein.

TABLE 25

| | |
|---|---|
| [9, 50] | 49 48 47 44 38 32 28 27 25 22 16 14 13 12 10 9 8 7 5 4 1 P9 45 40 39 33 26 24 23 20 17 11 P5 50 29 15 6 2 P10 43 36 21 19 18 3 P8 37 31 P4 46 P19 41 P11 42 35 34 30 P1 P2 P3 P6 P7 P12 P13 P14 P15 P16 P17 P18 |
| [51, 100] | 100 97 96 91 89 88 87 82 75 70 69 68 67 62 61 59 56 53 52 49 48 43 42 40 39 38 35 34 28 27 26 25 24 23 21 20 18 16 12 11 10 8 7 5 4 2 1 P11 99 92 85 78 77 76 72 65 63 60 57 41 37 32 31 30 29 22 17 9 P7 95 86 80 73 64 58 55 46 45 36 14 P18 98 83 79 51 44 13 P10 93 81 74 71 33 P3 90 66 15 3 P2 94 19 P14 84 54 50 47 6 P1 P4 P5 P6 P8 P9 P12 P13 P15 P16 P17 P19 |
| [101, 150] | 149 146 142 139 138 137 135 132 128 127 126 122 120 118 117 115 113 111 110 107 106 103 102 99 92 91 90 88 87 85 82 81 80 79 77 76 74 73 72 70 68 67 62 60 59 57 51 50 47 40 38 37 35 34 32 31 30 24 19 18 15 11 8 5 4 P7 150 147 141 125 119 112 109 98 93 89 84 78 75 71 66 61 58 55 54 52 48 46 43 42 33 29 27 25 23 21 14 13 10 7 6 2 1 P11 145 136 130 123 114 108 105 96 95 86 64 41 36 28 22 20 17 12 P18 143 131 124 121 94 83 63 44 39 9 3 P3 148 133 123 101 49 45 26 16 P10 140 134 97 65 P16 53 P6 144 116 104 100 69 56 P1 P2 P4 P5 P8 P9 P12 P13 P14 P15 P17 P19 |
| [151, 200] | 200 198 197 196 195 193 190 189 188 185 184 181 180 179 175 174 171 170 169 168 164 162 161 160 159 153 149 147 141 134 133 131 129 128 127 126 122 116 115 113 112 109 108 107 102 101 100 98 97 93 92 91 90 89 88 87 84 78 76 74 73 72 70 66 64 61 60 47 44 39 38 36 34 33 32 25 21 18 15 13 11 10 9 8 7 6 P16 187 186 183 178 176 173 166 165 163 156 146 144 143 140 137 130 119 110 106 105 103 94 85 82 79 75 71 68 65 63 62 59 56 53 50 41 31 30 29 28 27 26 24 23 2017 14 5 4 2 1 P19 199 194 192 167 158 152 148 132 125 121 114 111 99 96 86 83 77 69 46 43 37 35 12 P15 191 177 155 151 139 136 123 117 81 80 67 57 54 48 40 22 19 P6 145 142 135 124 95 58 55 52 16 3 P2 182 172 150 45 P4 118 104 49 P18 157 154 138 120 51 42 P1 P3 P5 P7 P8 P9 P10 P11 P12 P13 P14 P17 |
| [201, 250] | 250 248 247 246 245 243 240 239 238 235 234 231 230 229 225 224 221 220 219 218 214 212 211 210 209 203 199 197 191 184 183 181 179 178 177 176 172 166 165 163 162 159 158 157 152 151 150 148 147 143 142 141 140 139 138 137 134 128 126 124 123 122 120 116 114 111 110 97 94 89 88 86 84 83 82 75 71 68 65 63 61 60 59 58 57 56 48 47 46 42 40 37 36 35 34 30 29 28 25 24 20 19 17 12 11 10 9 8 7 5 4 3 2 1 P16 237 236 233 228 226 223 216 215 213 206 196 194 193 190 187 180 169 160 156 155 153 144 135 132 129 125 121 118 115 113 112 109 106 103 100 91 81 80 79 78 77 76 74 73 70 67 64 55 54 52 51 49 44 41 39 38 31 27 26 23 22 14 P19 249 244 242 217 208 202 198 182 175 171 164 161 149 146 136 133 127 119 96 93 87 85 62 45 33 18 16 6 P15 227 207 204 200 192 189 188 186 174 173 168 131 105 99 95 92 43 P8 222 195 170 130 107 104 101 90 69 66 53 P3 232 145 108 102 98 32 21 P4 241 185 154 13 P11 205 201 167 117 72 50 15 P1 P2 P5 P6 P7 P9 P10 P12 P13 P14 P17 P18 |
| [251, 300] | 300 298 297 296 295 293 290 289 288 285 284 281 280 279 275 274 271 270 269 268 264 262 261 260 259 253 249 247 241 234 233 231 229 228 227 226 222 216 215 213 212 209 208 207 202 201 200 198 197 193 192 191 190 189 188 187 184 178 176 174 173 172 170 166 164 161 160 147 144 139 138 136 134 133 132 125 121 118 115 113 111 110 109 108 107 106 98 97 96 92 90 87 86 85 84 80 79 78 75 74 70 69 67 62 61 60 59 58 57 55 54 53 52 51 50 48 47 43 40 39 38 35 34 32 31 28 26 25 23 10 18 16 14 13 12 8 4 3 P16 294 287 286 277 276 272 267 266 263 257 254 245 244 242 238 235 220 217 211 206 204 203 199 195 186 185 183 180 177 171 169 163 162 157 154 151 148 142 137 131 130 129 128 127 126 124 122 116 112 105 103 102 100 99 95 89 88 82 77 73 71 65 56 46 45 44 42 33 29 24 20 9 2 1 P17 299 291 282 265 250 248 232 230 223 214 210 194 179 175 167 165 145 140 135 119 114 93 91 81 76 68 63 49 41 36 27 17 15 5 P1 278 258 255 251 243 240 239 237 225 224 219 182 156 150 146 143 94 22 11 P9 273 246 221 181 158 155 152 141 120 117 104 37 30 7 6 P4 283 196 159 153 149 83 72 P5 292 236 205 64 P12 256 252 218 168 123 101 66 21 10 P2 P3 P6 P7 P8 P10 P11 P13 P14 P15 P18 P19 |
| [301, 350] | 350 348 347 346 345 343 340 339 338 335 329 325 324 321 334 331 330 320 319 318 314 312 311 310 309 303 299 297 291 284 283 281 279 278 277 276 272 266 265 263 262 259 258 257 252 251 250 248 247 243 242 241 240 239 238 237 234 228 226 224 223 222 220 216 214 211 210 197 194 |

TABLE 25-continued

```
         189 188 186 184 183 182 175 171 168 165 163 161 160 159 158 157 156 148 147 146 142 140 137
         136 135 134 130 129 128 125 124 120 119 117 112 111 110 109 108 107 105 104 103 102 101 100
         98 97 93 90 89 88 85 84 32 81 78 76 75 73 69 68 66 64 63 62 56 54 53 50 47 42 39 36 34 32 28 27
         25 24 23 21 19 17 16 14 13 12 11 9 3 7 5 4 2 1 P16 344 337 338 327 326 322 317 316 313 307 304
         295 294 292 288 285 270 267 261 256 254 253 249 245 236 235 233 230 227 221 219 213 212 207
         204 201 198 192 187 181 180 179 178 177 170 174 172 166 162 155 153 152 150 149 145 139 138
         132 127 123 121 115 106 96 95 94 92 83 79 74 70 59 52 51 49 46 45 43 37 33 29 20 18 6 P17 349
         341 332 315 300 298 282 280 273 264 260 244 229 225 217 215 195 190 185 169 164 143 141 131
         126 118 113 99 91 86 77 67 65 55 48 40 35 26 22 15 10 3 P1 328 308 305 301 293 290 289 287 275
         274 269 232 206 200 196 193 144 72 61 31 30 P9 323 296 271 231 208 205 202 191 170 167 154 87
         80 57 56 41 38 P4 333 246 209 203 199 133 122 P5 342 286 255 114 P12 306 302 268 218 173 151
         116 71 60 44 P2 P3 P6 P7 P8 P10 P11 P13 P14 P15 P18 P19
[351, 400] 400 397 393 390 389 388 386 383 379 378 377 373 371 369 368 366 364 362 361 358 357 354 353
         350 343 342 341 339 338 336 333 332 331 330 328 327 325 324 323 321 319 318 313 311 310 308
         302 301 298 291 289 268 286 285 283 282 281 275 270 269 266 262 259 256 255 250 249 248 245
         243 242 236 235 234 232 226 224 223 221 217 215 214 212 210 208 207 206 204 202 201 196 195
         193 191 189 188 184 183 181 180 177 174 173 172 169 166 161 160 159 158 157 155 154 150 148
         145 144 143 142 141 134 132 131 130 127 126 124 123 121 119 118 118 113 112 111 110 107 104
         103 102 101 97 95 94 92 89 86 85 83 80 79 75 74 72 71 68 63 62 59 57 55 53 50 47 46 41 40 39 35
         33 32 29 28 26 25 24 20 19 18 17 15 13 12 10 9 7 6 5 P8 399 398 395 394 392 384 381 380 376 370
         367 365 360 356 352 349 348 347 344 337 326 326 322 314 312 309 307 305 303 300 299 296 294
         293 290 279 278 277 274 272 268 264 260 253 244 241 239 238 237 230 229 228 227 218 213 199
         194 192 190 186 185 178 176 175 168 167 164 162 156 151 140 139 138 135 133 117 114 99 98 96
         84 76 64 61 60 54 52 49 48 45 44 43 42 36 23 22 21 16 4 3 P15 396 385 375 374 359 334 316 315
         297 292 287 284 276 273 261 247 233 225 211 209 198 197 187 179 170 153 152 147 128 125 108
         100 82 78 77 73 69 67 66 58 51 38 34 31 27 14 P16 387 363 346 340 306 271 265 263 231 220 205
         149 146 137 122 115 91 88 81 70 65 56 37 30 11 8 P19 372 345 320 280 257 254 251 240 219 216
         203 136 129 108 105 90 87 2 1 P3 382 295 258 252 248 182 171 P4 391 335 304 163 P11 355 351
         317 267 222 200 165 120 109 93 P1 P2 P5 P6 P7 P9 P10 P12 P13 P14 P17 P18
```

FIGS. 7A and 7B are diagrams illustrating effects of the disclosure according to an embodiment. First, FIG. 7A illustrates comparison between a case in which an interleaver according to the disclosure is applied and a case in which an interleaver according to an existing method with the length of information bits from 9 to 200 is applied. FIG. 7B illustrates comparison between a case in which an interleaver according to the disclosure is applied and a case in which an interleaver according to another existing method is applied to prepare the length of information bits from 9 to 200.

FIGS. 7A and 7B show tables for comparison between an early termination gain when an interleaver according to the disclosure is applied and an early termination gain when an existing interleaver is used.

According to FIG. 7A and FIG. 7B, it is possible to design an interleaver having a larger early termination gain compared to the known interleaver design method from the disclosure. Among the known interleaver design methods, representatively, there is a design using a greedy method for Kmax. FIG. 7A illustrates an interleaver using the greedy method for Kmax. In this case, when nDCRC=6, Kmin=9, Kmax=200, and j=1, results obtained by comparing an average early termination gain with the interleaver according to the disclosure are shown. Even though a single interleaver is used in the same manner, the interleaver design method proposed in the disclosure shows improvement in the early termination gain with an average of 8.1%. In addition, FIG. 7B illustrates an average early termination gain in a case in which the interleaver according to the disclosure and the existing technology are used when nDCRC=6, Kmin=9, Kmax=200, and j=4. As illustrated in FIG. 7B, when the interleaver according to the disclosure is used, a significant improvement can be seen, and on average, an improvement in the early termination gain of 12.2% is shown.

The disclosure can be used in an apparatus for transmitting/receiving data in a wireless communication system using polar codes.

The invention claimed is:

1. A data transmission apparatus in a wireless communication system using a polar code, the data transmission apparatus comprising:
   an error detection information generator configured to:
      generate a series of error detection bits having a first length that corresponds to a second length of a series of information bits to be transmitted; and
      concatenate the generated series of error detection bits with the series of information bits, resulting in a series of input bits having a third length that is a sum of the first length of the generated series of error detection bits and the second length of the series of information bits;
   a multi-interleaver configured to perform interleaving on the series of input bits according to the third length, resulting in a transmission bit string;
   a mapping and polar encoder configured to:
      map the transmission bit string to a subchannel, resulting in mapped bits; and
      polar-encode the mapped bits, resulting in polar-encoded data; and
   a transceiver configured to transmit the polar-encoded data through the subchannel,
   wherein the multi-interleaver includes:
      two or more constituent interleavers, each of which is configured to perform interleaving according to a different minimum input length and maximum input length, such that one of the two or more constituent interleavers is configured to perform interleaving on the series of input bits having the third length, resulting in the transmission bit string;
      an input switch configured to perform switching such that the series of input bits having the third length is input to the one of the two or more constituent interleavers; and
      an output switch configured to perform switching such that the transmission bit string is output from the one of the two or more constituent interleavers, and wherein each of the two or more constituent interleavers is configured to:
for the series of input bits including the series of information bits, based on the second length being smaller than the maximum input length, insert a number of nulls into the series of input bits such that the sum of the second length and the number of nulls equals the maximum input length, resulting in a padded series of input bits, and
perform interleaving on the padded series of input bits such that at least one bit of the generated series of error detection bits is located between two bits of the series of information bits, resulting in the transmission bit string.

2. The data transmission apparatus as claimed in claim 1, wherein the at least one bit of the generated series of error detection bits that is located between the two bits of the series of information bits indicates whether information bits of the transmission string that are located before the at least one bit of the generated series of error detection bits have errors.

3. The data transmission apparatus as claimed in claim 2, wherein indexes of the series of information bits in a binary matrix are used to determine a location of at least one bit of the generated series of error detection bits in the transmission bit string based on a matrix obtained using row interleaving of the binary matrix.

4. The data transmission apparatus as claimed in claim 1, further comprising:
a controller configured to control information, to be generated or transmitted, about the third length that is the sum of the second length of the series of information bits to be transmitted and the first length of the generated series of error detection bits.

5. A data transmission method in a wireless communication system using a polar code, the data transmission method comprising:
generating a series of error detection bits having a first length that corresponds to a second length of a series of information bits to be transmitted;
concatenating the generated series of error detection bits with the series of information bits, resulting in a series of input bits having a third length that is a sum of the first length of the generated series of error detection bits and the second length of the series of information bits;
performing interleaving on the series of input bits according to the third length, resulting in a transmission bit string;
mapping the transmission bit string to a subchannel, resulting in mapped bits;
polar-encoding the mapped bits, resulting in polar-encoded data; and
transmitting the polar-encoded data through the subchannel,
wherein the interleaving is performed according to two or more interleaving operations, each or which is performed according to a different minimum input length and maximum input length, such that one of the two or more interleaving operations is performed on the series of input bits having the third length, and
wherein for the series of input bits including the series of information bits, based on the second length being smaller than the maximum input length, each respective interleaving operation of the two or more interleaving operations includes:
inserting a number of nulls into the series of input bits such that the sum of the second length and the number of nulls equals the maximum input length of the respective interleaving operation, resulting in a padded series of input bits, and
performing interleaving on the padded series of input bits such that at least one bit of the generated series of error detection bits is located between two bits of the series of information bits, resulting in the transmission bit string.

6. The data transmission method as claimed in claim 5, wherein the at least one bit of the generated series of error detection bits that is located between the two bits of the series of information bits indicates whether information bits of the transmission string that are located before the at least one bit of the generated series of error detection bits have errors.

7. The data transmission method as claimed in claim 6, wherein indexes of the series of information bits in a binary matrix are used to determine a location of at least one bit of the generated series of error detection bits in the transmission bit string based on a matrix obtained using row interleaving of the binary matrix.

8. The data transmission method as claimed in claim 5, further comprising:
generating and transmitting information about the third length that is the sum of the second length of the series of information bits to be transmitted and the first length of the generated series of error detection bits.

9. A data reception apparatus in a wireless communication system using a polar code, the data reception apparatus comprising:
a transceiver configured to receive, from a wireless channel, configuration information of a polar code and polar-encoded data transmitted through a predetermined subchannel;
a polar code decoder configured to:
generate a parity check matrix based on the configuration information of the polar code; and
decode the polar-encoded data using the parity check matrix;
a multi-deinterleaver configured to perform deinterleaving according to a length of an output of the polar code decoder, resulting in an output of the multi-deinterleaver; and
an error inspector configured to perform error inspection using the output of the multi-deinterleaver,
wherein the multi-deinterleaver includes:
two or more constituent deinterleavers configured to perform deinterleaving in two or more different schemes based on the configuration information of the polar code;
an input switch configured to connect the polar code decoder to one of the two or more constituent deinterleavers; and
an output switch configured to output a transmission bit string deinterleaved in one of the two or more constituent deinterleavers to the error inspector, and
wherein the polar code decoder is further configured to:
generate the parity check matrix using an error detection bit-generation polynomial, an interleaver, and a length of a received input bit string based on the configuration information of the polar code,
sequentially perform polar-decoding based on the generated parity check matrix,
determine whether a reception error of the polar-encoded data exists based on comparison of a linear combination value for a decoding result value of preceding bits with parity bits when the parity bits are decoded, and terminate decoding of the polar-encoded data early based on the reception error of the polar-encoded data existing.

10. The data reception apparatus as claimed in claim 9, wherein at least one of the parity bits is located between two information bits in the polar-encoded data.

11. The data reception apparatus as claimed in claim 10, wherein the configuration information of the polar code is received in advance before the polar-encoded data is transmitted.

12. The data reception apparatus as claimed in claim 10, wherein the configuration information of the polar code is received through higher layer signaling.

13. A data reception method in a wireless communication system using a polar code, the data reception method comprising:

receiving configuration information of a polar code from a wireless channel;

receiving polar-encoded data transmitted through a predetermined subchannel;

generating a parity check matrix based on the configuration information of the polar code;

decoding the polar-encoded data using the parity check matrix, resulting in an output of polar decoding;

performing deinterleaving according to a length of the output of polar decoding, resulting in an output of the deinterleaving; and performing error inspection using the output of the deinterleaving, wherein deinterleaving is performed in two or more different schemes based on the configuration information of the polar code at a time of deinterleaving, and wherein the decoding of the polar code includes:

generating the parity check matrix using an error detection bit-generation polynomial, an interleaver, and a length of a received input bit string based on the configuration information of the polar code, sequentially performing polar-decoding based on the generated parity check matrix, determining whether a reception error of the polar-encoded data exists based on a comparison of a linear combination value for a decoding result value of preceding bits with parity bits when the parity bits are decoded, and terminating decoding of the polar-encoded data early based on the reception error of the polar-encoded data existing.

14. The data reception method as claimed in claim 13, wherein at least one of the parity bits is located between two information bits in the polar-encoded data.

15. The data reception method as claimed in claim 14, wherein the configuration information of the polar code is received in advance before the polar-encoded data is transmitted, and the configuration information of the polar code is received through higher layer signaling.

* * * * *